United States Patent
Watanabe et al.

(10) Patent No.: US 7,315,997 B2
(45) Date of Patent: Jan. 1, 2008

(54) METHOD AND APPARATUS FOR SUPPORTING DESIGNING OF LSI, AND COMPUTER PRODUCT

(75) Inventors: Hitoshi Watanabe, Kawasaki (JP); Hideaki Konishi, Kawasaki (JP); Yuko Katoh, Kawasaki (JP); Kazuyuki Yamamura, Kawasaki (JP); Naoko Karasawa, Kawasaki (JP); Takeshi Doi, Kawasaki (JP); Osamu Ōkano, Kawasaki (JP); Junko Kumagai, Kawasaki (JP); Koichi Itaya, Kawasaki (JP); Daisuke Tsukuda, Kawasaki (JP); Ryuji Shimizu, Kawasaki (JP); Toshihito Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 300 days.

(21) Appl. No.: 10/846,517

(22) Filed: May 17, 2004

(65) Prior Publication Data

US 2005/0172254 A1    Aug. 4, 2005

(30) Foreign Application Priority Data

Jan. 29, 2004   (JP)   ............................ 2004-022253

(51) Int. Cl.
*G06F 17/50*    (2006.01)

(52) U.S. Cl. .................................................. 716/11
(58) Field of Classification Search .................. 716/11
See application file for complete search history.

(56) References Cited

U.S. PATENT DOCUMENTS 5,715,171 A * 2/1998 Mori et al. .................... 716/18
6,106,568 A * 8/2000 Beausang et al. ............. 716/18

* cited by examiner

*Primary Examiner*—Jack Chiang
*Assistant Examiner*—Brandon Bowers
(74) *Attorney, Agent, or Firm*—Staas & Halsey LLP

(57) ABSTRACT

A design support apparatus includes a unit that inputs a user net list created by using hard macro cells excluding test circuits, and a unit that arranges hard macro cells using a frame into which hard macro cells, where timing-converged physical information includes test terminals, and test circuits are embedded as arrangement/wiring information. Moreover, includes a unit that arranges and wires the test circuits using the arrangement/wiring information of the test circuit embedded into the frame, a unit that recognizes arrangement/wiring information where the arrangement/wiring information of the test circuits is removed from arrangement/wiring information obtained by wiring, and a unit outputs a net list of a logic structure.

13 Claims, 27 Drawing Sheets

FIG.7

| NAME OF HARD MACROCELL | LOGICAL INFORMATION ,310 | PHYSICAL INFORMATION ,320 |
|---|---|---|
| PLL | 311 — [OUT, DIV[4:0],PHSEN,Reset, TRES, REF] | [OUT, FB,PHS240, Lock,CK/16, MT, DIV[4:0],PHSEN,Reset, TRES, REF] 331 TEST CIRCUIT — 341, 321 |
| FF | 312 — [D Q, ▷CK] | [D Q, SI SO, SE TEST CIRCUIT, ▷CK] 342, 322, 332 |
| RAM | 313 — [DataIn, DataOut, Address, CK] | [cntrl, MDI MDO, TEST CIRCUIT, DataIn, DataOut, Address, CK] 343, 333, 323 |
| BSR | 314 — ▷ — 334 | 324 — [BSR] — 344 / 334 — 344 |
| TAP CONTROL-LER | 315 — [TCK, TDI, TMS, TRST, TDOD, TDOE, UTST] | [TCK, TDI, TMS, TRST, TDOD, TDOE, UTST, XTST, ⋮, etc] 325, 345 |

```
<CONNECTION INFORMATION OF BOUNDARY SCAN CHAIN>

DFT-ORDER : NETKIND = BOUNDARY_SCAN_CHAIN ;

net_order : name = @BOUNDARY_SCAN_CHAIN, top_module = CA91M20999 ;
  IN1   : INBSR ;
  IN2   : INBSR ;
  IN3   : INBSR ;
  OUT1  : OUTBSR ;
  OUT2  : OUTBSR ;
  INOUT : INOUTBSR ;
net_order_end;
DFT-ORDER_END;
```

```
<CONNECTION INFORMATION OF INITIALIZNG SIGNAL LINE>

DFT-ORDER : NETKIND = MDI ;

net_order : name = @SDI2, top_module = CA91M20999, group_no = 1 ;
  + @domain1_2;
net_order_end;

instance_group : name = @domain1_2, top_module = CA91M20999 ;
  AA1.BB1.RAM1 {DSI} ;
  AA1.BB1.RAM2 {DSI} ;
  AA1.BB1.RAM3 {DSI} ;
  AA1.BB2.RAM1 {DSI} ;
  AA2.BB1.RAM2 {DSI} ;
instance_group_end;
DFT-ORDER_END ;
```

<CONNECTION INFORMATION OF RESULT PROCESSING SIGNAL LINE>

DFT-ORDER : NETKIND = MDO ;

net_order : name = chain0 , top_module = CA91M20999 , group_no = 0 ;
  bit = 0 : AA3.BB1.RAM1 ;
net_order_end ;

net_order : name = chain1 , top_module = CA91M20999 , group_no = 1 ;
  bit = 0 : AA1.BB1.RAM1 ;
  bit = 2 : AA1.BB1.RAM2 ;
  bit = 5 : AA1.BB1.RAM3 ;
  bit = 7 : AA1.BB2.RAM1 ;
  bit = 8 : AA2.BB1.RAM2 ;
net_order_end ;

<CONNECTION INFORMATION OF PLL MONITOR SIGNAL LINE>

DFT-ORDER : NETKIND = PLL_LOCK ;
net_order : name = chain0 , top_module = CA91M20999 , group_no = 0 ;
  bit = 0 : ABC.PLL1 ;
  bit = 1 : DEF.PLL2 ;
net_order_end ;
net_order : name = chain1 , top_module = CA91M20999 , group_no = 1 ;
net_order_end ;
  bit = 1 : DEF.PLL4 ;
net_order_end ;
DFT-ORDER_END ;

<CONNECTION INFORMATION OF SCAN CHAIN>

DFT-ORDER : NETKIND = SCAN_CHAIN ;

net_order : name = @SDI_0, top_module = CA91M20999, group_no = 0, scan_bits = 1664 ;
 + @domain0_1;
net_order_end;

instance_group : name = @domain0_1, top_module = CA91M20999 ;
 AA1.BB1.FF1 {SI,SO} ;
 AA1.BB2.FF1 {SI,SO} ;
 AA1.BB2.RAM1 {SDI,SDO} ;
 AA2.BB2.RAM2 {SDI,SDO} ;
 AA2.BB2.FF1 {SI,SO} ;
 AA2.BB2.FF2 {SI,SO} ;
 AA2.BB2.FF3 {SI,SO} ;
instance_group_end;

DFT-ORDER_END;

<CONNECTION INFORMATION OF CLOCK LINE>

DFT-ORDER : NETKIND = SCAN_CLOCK ;

net_order : name = @SCANCK1, top_module = CA91M20999, group_no = 0 ;
 + @domain0_1 ;
net_order_end;

instance_group : name = @domain0_1, top_module = CA91M20999 ;
 AA1.BB1.FF1 {CK} ;
 AA1.BB2.FF1 {CK} ;
 AA1.BB2.RAM1 {CLK} ;
 AA2.BB2.RAM2 {CLK} ;
 AA2.BB2.FF1 {CK} ;
 AA2.BB2.FF2 {CK} ;
 AA2.BB2.FF3 {CK} ;
instance_group_end ;

DFT-ORDER_END ;

<CONNECTION INFORMATION OF CHIP EXTERNAL TERMINAL> scan_clock : hlb = CA91M20999,
 group_pos = 0,
 input_extpin = SCANCK1,
 active_level = POSI,
 iobuffer = IOJMI2TNNMNNXXX0 ;

internal_scan_in : chain_no =0,input_extpin = SDI1, iobuffer = IOJMI2TNNMNNXXX0;
internal_scan_out : chain_no =0,output_extpin = SDO1, iobuffer = IOJMO2TNXXXXNNM0 ;
internal_scan_in : chain_no =1,input_extpin = SDI2, iobuffer = IOJMI2TNNMNNXXX0;
internal_scan_out : chain_no =1,output_extpin = SDO2, iobuffer = IOJMO2TNXXXXNNM0 ;

memory_bist_in : group_pos =0,input_extpin = SDI1, iobuffer = IOJMI2TNNMNNXXX0
memory_bist_in : group_pos =1,input_extpin = SDI2, iobuffer = IOJMI2TNNMNNXXX0 ;
memory_bist_out: group_pos =0,output_extpin =SDO1, iobuffer=IOJMO2TNXXXXNNM0;
memory_bist_out: group_pos =1,output_extpin =SDO2, iobuffer=IOJMO2TNXXXXNNM0;

pll_lock: group_pos =0,output_extpin =LTST1, iobuffer=IOJMO2TNXXXXNNM0;
pll_lock: group_pos =1,output_extpin =LTST2, iobuffer=IOJMO2TNXXXXNNM0;

METHOD AND APPARATUS FOR SUPPORTING DESIGNING OF LSI, AND COMPUTER PRODUCT

CROSS-REFERENCE TO RELATED APPLICATIONS

This application is based upon and claims the benefit of priority from the prior Japanese Patent Application No. 2004-022253, filed on Jan. 29, 2004, the entire contents of which are incorporated herein by reference.

BACKGROUND OF THE INVENTION

1) Field of the Invention

The present invention relates to a technology for supporting designing of large scale integrated circuit (LSI).

2) Description of the Related Art

In designing LSI's, there is a requirement to increase working efficiency by shortening the duration required for designing, and to mount the system on one chip. FIG. 1 is an explanatory diagram of one example of a conventional design flow. In FIG. 1, a designer creates a user net list 2701 which represents a logic circuit at a gate level. The designer creates an interface (I/F) file 2702 in order to carry out test synthesis. This file 2702 includes boundary scan information representing a connection relationship between a test circuit and a hard macro in the user net list 2701, clock connection information at the time of a test, memory simultaneous test information, internal scan chain information, phase locked loop (PLL) terminal information, test terminal information, and the like.

The I/F file 2702 is captured into the user net list 2701 and a test circuit is inserted, so that the test synthesis is carried out (step S2701). A test-synthesized net list 2703 is laid out based on arrangement/wiring area information in a frame 2704 (step S2702). FIG. 2 is an explanatory diagram of a conventional frame. The frame 2800 is information representing areas where cells and nets can be arranged and wired on the layout of the LSI. In FIG. 1, the laid-out data are output as graphic data system (GDS) to a later LSI development step, and are output as a net list 2705 to a user. A test pattern 2706 is created based on the net list 2705 (step S2703), and the net list can be utilized also as a failure analysis net list.

In the process flow, rule checks R1 to R3 on the net list are made before and after the test synthesis, and after the layout. At the rule check R1 before the test synthesis, the check is made whether the user net list 2701 can be test-synthesized by using a test synthesis tool (step S2701). At the rule check R2 after the test synthesis, the check is made whether setting in the test-synthesized net list 2703 is correct. At the rule check R3 after the layout, the check is made whether a test circuit is influenced such that the logic in the test circuit is rewritten. When an error occurs at the rule check R1, redesign on the user net list 2701 is required. When an error occurs at the rule check R2, the test synthesis is again required. When an error occurs at the rule check R3, the layout is again required.

Due to the layout (step S2702), a plurality of random access memories (RAM) are developed on the frame 2800. FIG. 3 is an explanatory diagram of a state that a plurality of RAMs is laid out on the frame 2800. In FIG. 3, a RAM 2091 includes a core 2911 where a bit/word configuration is 20×1024, a RAM 2902 includes a core 2912 where a bit/word configuration is 40×512, and a RAM 2903 includes a core 2913 where a bit/word configuration is 80×256. Controllers 2921 to 2923 are provided on input sides of the RAMs 2901 to 2903, respectively. When tests are conducted for on the RAMs 2091 to 2903, an initializing signal MDI is input so that the tests are conducted for the RAMs 2901 to 2903. Output data MDO are output from the RAMs 2901 to 2903 via a selector 2930.

The layout (step S2702) makes it possible to suitably prepare and wire various boundary scan registers (BSR) for input, output, bus, 3-STATE, clock, shared input/scan in, shared output/scan out, and the like on the frame 2800 according to a configuration of an I/O area of the LSI.

Due to the layout (step S2702), BSR cells are sequentially arranged so that a boundary scan chain can be formed. FIG. 4 is an explanatory diagram of the boundary scan chain formed by sequentially arranging the BSRs. In FIG. 4, the boundary scan chain 3000 is formed by sequentially arranging a plurality of BSR cells 3001 including BSRs. The boundary scan chain 3000 is cut at a portion near a Test Access Port (TAP) controller 3010. Due to this cutting, a cut area 3005 is formed between a BSR cell 3001S as a starting point of the boundary scan chain 3000 and a BSR cell 3001E as an end point. A control signal line of the TAP controller 3010 and a test signal line 3020 are connected so as to pass through the cut area 3005.

In the design made by the process flow, however, the test-synthesized net list 2703 is used so as to the layout is carried out (step S2702). At the test synthesis (step S2701), therefore, a test circuit should be inserted after contents of the test-synthesized layout are assumed. Accordingly, design efficiency is deteriorated, and realization of system on chip (SOC) is inhibited.

In the process flow, the test circuit is inserted by the test synthesis before the layout (step S2702). When the insertion of the test circuit is not considered at the time of logic design or is not sufficiently considered, however, timing convergence in the layout should be again carried out due to the circuit added by inserting the test circuit. As a result, increase in a number of steps causes a longer design period.

When the user net list 2701 is timing-converged, the timing convergence is again required due to the insertion of the test circuit in the test synthesis, and thus the increase in a number of the steps causes the lengthening of the design period. Further, when the test synthesis condition is largely different from an actual arrangement status, the wiring length increases and accordingly a test operating frequency is lowered.

When the designer creates the I/F file 2702 for the test synthesis, the test synthesis cannot be accurately carried out due to an artificial mistake such as an inputting error. A number of the step from the test synthesis to the test pattern increases, thereby causing the lengthening of the design period.

In the process flow, since the three rule checks (R1 to R3) are made, a number of the steps in the process flow increases, thereby causing the lengthening of the design period. When an error occurs in the rule check R1, the user net list should be redesigned, and when an error occurs in the rule check R2, the test synthesis is again required. Further, when an error occurs in the rule check R3, the layout is again required, thereby causing the lengthening of the design period.

In the process flow, the test circuit is inserted by the test synthesis before the layout (step S2702), but the test circuit influences the timing of a system mode. Accordingly, as the designer has to design the system mode with the insertion of the test circuit in mind, a strain on the designer is increased.

The RAMs 2901 to 2903 shown in FIG. 3 use the cores 2911 to 2913 having the different bit/word configurations, respectively, but the differences in the bit/word configuration among the RAMs 2901 to 2903 restrain a combination of simultaneous tests. This causes the lengthening of the test period. Further, in the process flow, since the test pattern is created for every macro cell of the RAMs, PLL, and the like mounted on the user net list 2701, it takes a long time to create the test patterns. This causes the lengthening of the design period.

When various BSRs are suitably prepared and wired, the flexibility in design increases, but the time for the design work also increases. Meanwhile, when control signal wiring information between the timing-adjusted TAP controller and BSR is added to the frame, the configuration of the control terminals is different according to types of the BSRs to be used, thereby decreasing the flexibility in design.

In FIG. 4, when the BSR cells 3001 are sequentially arranged, the sequential arrangement area of the boundary scan chain 3000 is cut in order to create the starting point and the end point of the boundary scan chain 3000 or to draw a control signal line of the TAP controller 3010. In this case, even if the sequential arrangement area is cut, the BSR cell 3001S as the starting point and the BSR cell 3001E as the end point of the boundary scan chain 3000 are limited to be on the cut position. Accordingly, when the wiring property between the BSR cell 3001S as the starting point and the BSR cell 3001E as the end point of the boundary scan chain 3000, and the TAP controller 3010 is considered, the TAP controller 3010 should be arranged near the cut area 3005 of the boundary scan chain 3000.

The terminal of the TAP controller 3010 should be similarly arranged near the cut area 3005 of the boundary scan chain 3000. Since the control signal line of the TAP controller 3010 and the test signal line 3020 are wired on the cut area 3005 of the boundary scan chain 3000, the cut area is excessively occupied when the control signal line and the test signal line 3020 increase. This inhibits the wiring on the area. As a result, the flexibility in design is deteriorated on the cut area 3005 of the boundary scan chain 3000 and its vicinity.

SUMMARY OF THE INVENTION

The present invention solves at least the problems in the conventional technology.

A design support apparatus according to an aspect of the present invention includes a frame storage unit that stores a frame including arrangement/wiring information of hard macro cells and test circuits having test terminals in timing-converged physical information; a user net list input unit that inputs a user net list without test circuits using hard macro cells having physical information with the same terminal configuration as that of the hard macro cells and not having test terminals in the logical information; a frame extraction unit that extracts the frame stored by the frame storage unit; and a hard macro cell arrangement unit that arranges the hard macro cells included in the user net list input by the user net list input unit based on arrangement/wiring information of the test circuits included in the frame extracted by the frame extraction unit.

A design support apparatus according to another aspect of the present invention includes a first boundary scan register having a predetermined test terminal; a second boundary scan register having the predetermined test terminal and that is different in type from the type of the first boundary scan register; and a frame where a signal line which can be connected to the predetermined test terminal is wired. Any one of the first and the second boundary scan registers is arranged on a arrangement area on the frame connectable to the signal line.

In design support apparatus according to still another aspect of the present invention, two arbitrary BSR cells are connected in an arrangement area between the two BSR cells in the boundary scan chain formed by a plurality of BSR cells, and a bypass cell that connects a signal line passing through the arrangement area is arranged on the arrangement area.

A design support method according to still another aspect of the present invention includes storing a frame including arrangement/wiring information of hard macro cells and test circuits having test terminals in timing-converged physical information; inputting a user net list without test circuits using hard macro cells having physical information with the same terminal configuration as that of the hard macro cells and not having test terminals in the logical information; extracting the frame stored in the storing; and arranging the hard macro cells included in the user net list input at the inputting based on arrangement/wiring information of the test circuits included in the frame extracted at the extracting.

A design support computer program according to still another aspect of the present invention contains instructions which when executed on a computer causes the computer to realize storing a frame including arrangement/wiring information of hard macro cells and test circuits having test terminals in timing-converged physical information; inputting a user net list without test circuits using hard macro cells having physical information with the same terminal configuration as that of the hard macro cells and not having test terminals in the logical information; extracting the frame stored in the storing; and arranging the hard macro cells included in the user net list input at the inputting based on arrangement/wiring information of the test circuits included in the frame extracted at the extracting.

A computer readable recording medium according to still another aspect of the present invention is for storing a design support computer program that contains instructions which when executed on a computer causes the computer to realize storing a frame including arrangement/wiring information of hard macro cells and test circuits having test terminals in timing-converged physical information; inputting a user net list without test circuits using hard macro cells having physical information with the same terminal configuration as that of the hard macro cells and not having test terminals in the logical information; extracting the frame stored in the storing; and arranging the hard macro cells included in the user net list input at the inputting based on arrangement/wiring information of the test circuits included in the frame extracted at the extracting.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 7 is an explanatory diagram of contents of hard macrocells stored in a user cell library;

FIG. 15 is an explanatory diagram (1) of a description example of an I/F file stored in an I/F file database in the process flow in FIG. 9;

FIG. 16 is an explanatory diagram (1) of a description example of an I/F file representing the connection information of the initializing signal line;

FIG. 17 is an explanatory diagram (1) of a description example of an I/F file representing the connection information of a result processing signal line;

FIG. 18 is an explanatory diagram (1) of a description example of an I/F file representing the connection information of a PLL monitor signal line;

FIG. 19 is an explanatory diagram (1) of a description example of an I/F file representing the connection information of the scan chain;

FIG. 20 is an explanatory diagram (1) of a description example of an I/F file representing the connection information of a clock line (scan clock);

FIG. 21 is an explanatory diagram (1) of a description example of an I/F file representing the connection information of a chip external terminal;

DETAILED DESCRIPTION

Exemplary embodiments of a design support apparatus, a design support method, a computer program, and a recording medium according to the present invention are explained in detail below with reference to the accompanying drawings.

Outline of Design Support System

Figure 5:
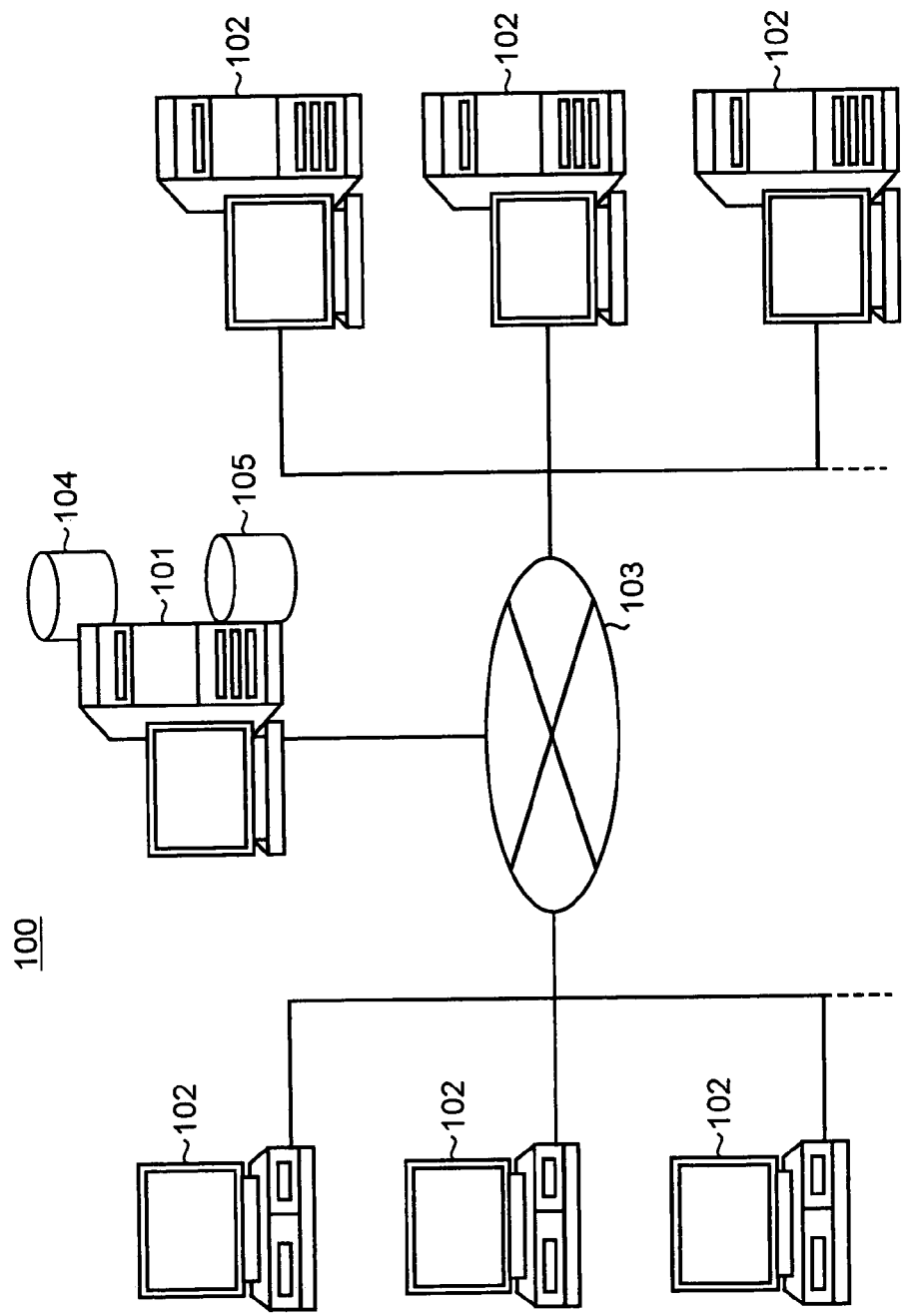
FIG. 5 is an explanatory diagram of a schematic configuration of a design support system according to an embodiment of the present invention.

A schematic configuration of a design support system according to an embodiment of the present invention is explained. FIG. 5 is an explanatory diagram of the schematic configuration of the design support system 100 according to the embodiment of the present invention. In FIG. 5, the design support system 100 is configured so that a design support apparatus 101 is connected to a plurality of information terminal devices 102 via a network 103 such as the Internet, a local area network (LAN), and a wide area network (WAN). The design support apparatus 101 supports design for LSI. The information terminal devices 102 require/request the design support apparatus 101 to support the design for LSI. The design support apparatus 101 and the information terminal devices 102 can communicate with each other. The design support system 100 has a user cell library 104 and a test cell library 105. These libraries 104 and 10.5 are explained later. A personal computer can be used as the information terminal device 102.

Figure 6:
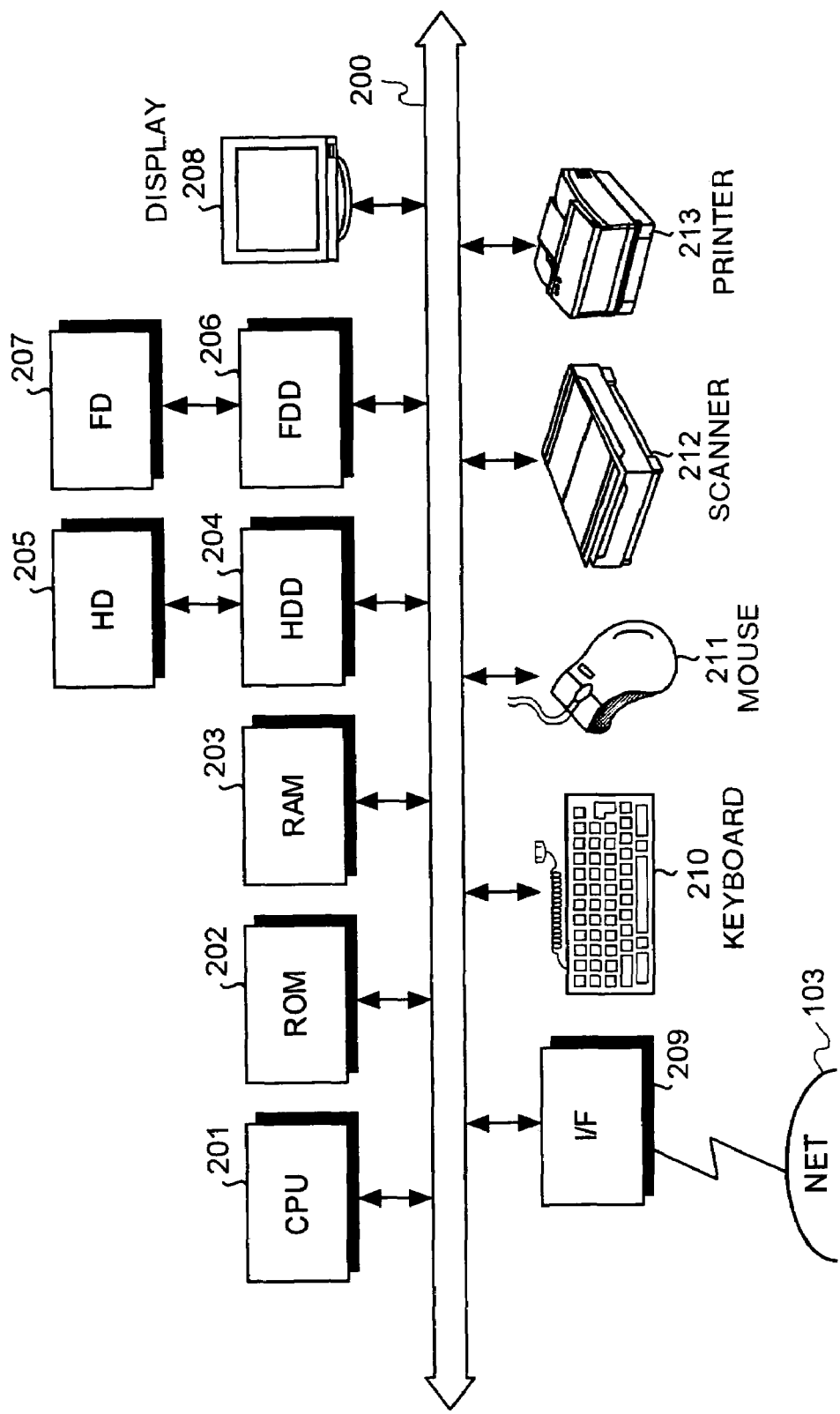
FIG. 6 is a block diagram of hardware configurations of a design support apparatus and an information terminal device in the design support system according to the embodiment of the present invention.

Hardware Configurations of Design Support Apparatus and Information Terminal Device The hardware configurations of the design support apparatus 101 and the information terminal device 102 in the design support system 100 according to the embodiment of the present invention are explained. FIG. 6 is a block diagram of the hardware configurations of the design support apparatus 101 and the information terminal device 102 in the design support system 100 according to the embodiment of the present invention.

In FIG. 6, the design support apparatus 101 and the information terminal device 102 have a central processing unit (CPU) 201, a read-only memory (ROM) 202, a RAM 303, a hard disc drive (HDD) 204, a hard disc (HD) 205, a flexible disc drive (FDD) 206, a flexible disc (FD) 207 as one example of a detachable recording medium, a display 208, an I/F 209, a keyboard 210, a mouse 211, a scanner 212, and a printer 213. The components are connected with one another by a bus 200.

The CPU 201 controls the entire design support apparatus 101 and information terminal device 102. The ROM 202 stores programs such as a boot program therein. The RAM 203 is used as a work area of the CPU 201. The HDD 204 controls reading/writing of data from/into the HD 205 according to the control of CPU 201. The HD 205 stores the data written by the control of the HDD 204 therein.

The FDD 206 controls reading/writing of data from/into the FD 207 according to the control of the CPU 201. The FD 207 stores the data written by the control of the FDD 206 therein, and the design support apparatus 101 and the information terminal devices 102 read the stored data from the FD 207.

As the detachable recording medium, besides the FD 207, CD-ROM (CD-R, CD-RW), magneto optical (MO), digital versatile disk (DVD), memory card, and the like may be used. The display 208 displays a cursor, icons, tool boxes, and data such as documents, images, and functional information. As the display 208, for example, cathode ray tube (CRT), a thin film transistor (TFT) liquid crystal display, a plasma display, and the like can be adopted.

The I/F 209 is connected to the network 103 such as the Internet via a communication line, and is connected to other devices via the network 103. The I/F 209 controls the network 103 and an internal interface so as to control input/output of data from the external devices. As the I/F 109, for example, a modem, a LAN adapter, and the like can be adopted.

The keyboard 210 has keys for inputting characters, numbers, various instructions, and the like, and inputs data. Further, it may be a touch panel type input pad, a ten key, and the like. The mouse 211 moves a cursor and selects its range, moves a window, and changes its size. As a pointing device, a trackball, a joystick, and the like may be used as long as they have the similar function.

The scanner 212 optically reads an image, and captures image data into the design support apparatus 101 and the information terminal devices 102. The scanner 212 may have an optical character reader (OCR) function. Further, the printer 213 prints image data and document data. As the printer 213, for example, a laser printer and an ink jet printer can be adopted.

The user cell library 104 shown in FIG. 5 is explained below. FIG. 7 is an explanatory diagram of contents of the hard macro cells stored in the user cell library 104. In FIG. 7, the user cell library 104 stores hard macrocells of a PLL, TAP controller, a flip-flop (FF), a RAM, a boundary scan register (BSR), and the like. The user cell library 104 has logical information 310 and physical information 320. In the user cell library 104, the physical information 320 has test terminals to be used at the time of tests. On the other hands, the logical information 310 has logic from which the test terminals are removed. Timing information of the logical information 310 other than the test terminals, and size information of the logical information 310 are equal with those in the physical information 320.

PLL is explained first. A test circuit 331 such as a PLL-Bist (built-in self test) circuit or a PLL-Test control circuit is inserted into a PLL 311 and a PLL 321. In the physical information 320, the PLL 321 has a test terminal 341, and the test terminal 341 is not present in the logical information 310. The PLL 311 and the PLL 321 are configured as hard macro in a timing convergence manner.

A test circuit 332 is inserted into an FF 312 and an FF 322. A test terminal 342 including a ScanEnable terminal, a Scanin terminal, and a ScanOut terminal is present in the physical information 320, but the test terminal 342 is not present in the logical information 310. The FF 312 and the FF 322 are configured as a hard macro in the timing convergence manner.

A test circuit (a BIST circuit or a scan circuit) 333 is inserted into a RAM 313 and a RAM 323. In the physical information 320, the RAM 323 has a test terminal 343, but the test terminal 343 is not present in the logical information 310. The RAM 313 and the RAM 323 are configured as a hard macro in the timing convergence manner.

A test circuit 334 is inserted into a BSR 314 and a BSR 324. In the physical information 320, the BSR 324 has a test terminal 344 for configuring the boundary scan chain, but the test terminal 344 is not present in the logical information 310. The BSR 314 and the BSR 324 are configured as a hard macro in the timing convergence manner. In the logical information 310, the BSR 314 can be referred to as a buffer.

A TAP controller 315 and a TAP controller 325 control the test circuits 331 to 334. In the physical information 320, the TAP controller 325 has a test terminal 345 which is connected with test circuits 331 to 334 so as to control a PLL-Test, a function test, a memory test, a boundary test. In the logical information 310, the test terminal 345 is not present. The TAP controller 315 and the TAP controller 325 are configured as a hard macro in the timing convergence manner.

Figure 8:
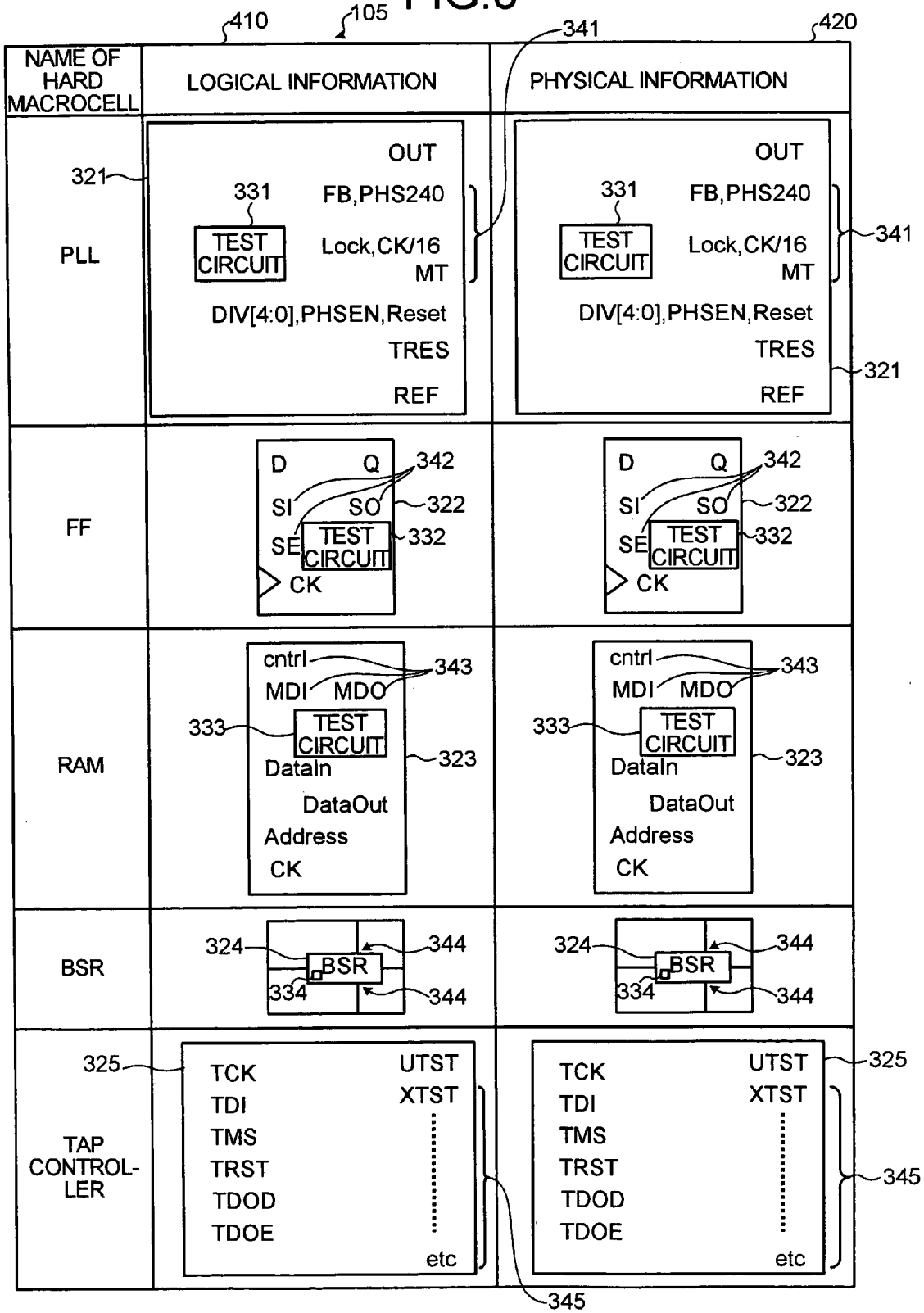
FIG. 8 is an explanatory diagram of contents of hard macrocells stored in a test cell library.

The test cell library 105 shown in FIG. 5 is explained below. FIG. 8 is an explanatory diagram of contents of the hard macro cells stored in the test cell library 105. The hard macro cells in the test cell library 105 have an identical terminal configuration, an identical size, and an identical timing in the logical information 410 and the physical information 420. Hard macro cells in the user cell library 104, which have the completely same specification and terminal configuration in the physical information as those in the physical information 420 of the hard macro cells in the test cell library 105, are present correspondingly to those in the test cell library 105. The corresponding hard macro cells present in the user cell library 104 and test cell library 105, however, have different cell names of the hard macros.

Figure 9:
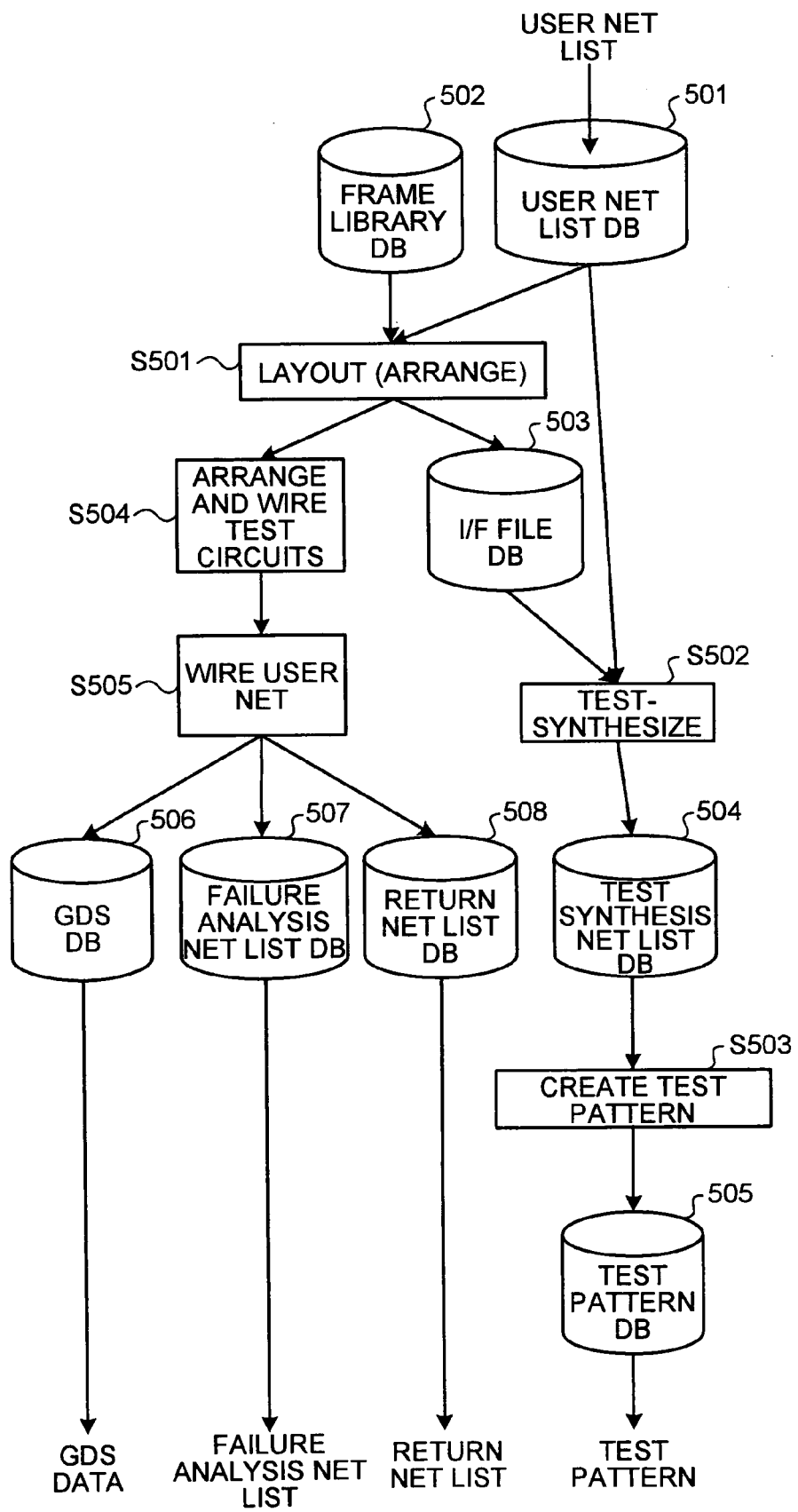
FIG. 9 is an explanatory diagram of a process flow of the design support apparatus according to the embodiment of the present invention.

The process flow of the design support apparatus according to the embodiment of the present invention is explained below. FIG. 9 is an explanatory diagram of the process flow of the design support apparatus according to the embodiment of the present invention. In FIG. 9, the user net lists which are transmitted from the information terminal devices 102 shown in FIG. 5 are stored in the user net list database 501. A timing-converged test cell library and the frame including the arrangement/wiring information of the hard macro cells and the test circuits shown in FIG. 8 are stored in the frame library database 502.

When LSI is designed by the design support apparatus 101, the user net list stored in the user net list database 501 is laid out based on the arrangement/wiring information stored in the frame library database 502 (step S501). In this layout, only the hard macro cells included in the user net list are arranged on the frame.

After the layout (step S501), an arrangement/wiring information I/F (interface) file of the arrangement position of the hard macro cells in the user net list and the test circuits in the frame is created so as to be stored in an I/F file database 503. Test synthesis is made based on the user net list stored in the user net list database 501 and the IF file stored in the I/F file database 503 (step S502). The test-synthesized user net list is stored in a test-synthesized net list database 504. A test pattern is created from the net list stored in the test-synthesized net list database 504 (step S503) so as to be stored in a test pattern database 505.

After the hard macro cells are arranged based on the arrangement/wiring information in the frame at step S501 along with the test synthesis (step S502), the test circuits are arranged and wired according to the arrangement/wiring information of the test circuits on the frame (step S504). After the test circuits are arranged and wired, the user net in the user net list stored in the user net list database 501 is wired (step S505). GDS (Graphic Data System: standard format of layout graphic database) data of the wiring/connection information created at step S505 are stored in a GDS database 506. A created failure analysis net list is stored in a failure analysis net list database 507, and a return net list is stored in a return net list database 508. The GDS data and the failure analysis net list are transmitted to a later development step. The return net list is transmitted to a user.

When the user net list created by using the logical information 310 in the user cell library 104 is input, the physical information 320 in the user cell library 104 is referred to in the layout at step S501. Accordingly, the hard macro cells in the user net list can be recognized as hard macro cells 321 to 325 having the test terminals 341 to 345. As a result, even when hard macro cells in a user net list without test terminals are input, the arrangement and wiring can be carried out in a state that test terminals are present. Since the return net list which is returned to the user is recognized by using the logical information 310 in the user cell library 104, the wiring of the test circuits 331 to 334, the test terminals 341 to 345, and the test terminals 341 to 345 are not output to the return net list database 508.

In the failure analysis net list, a layout tool swaps the names of the hard macro cells with the hard macro cells in the test cell library 105 having the completely same terminal configuration and specification as those in the user cell library 104 in the physical information. The swap process is explained later. When the net list is output after the swap, the net list including the test terminals and the test circuits, namely, the failure analysis net list can be output.

Figure 10:
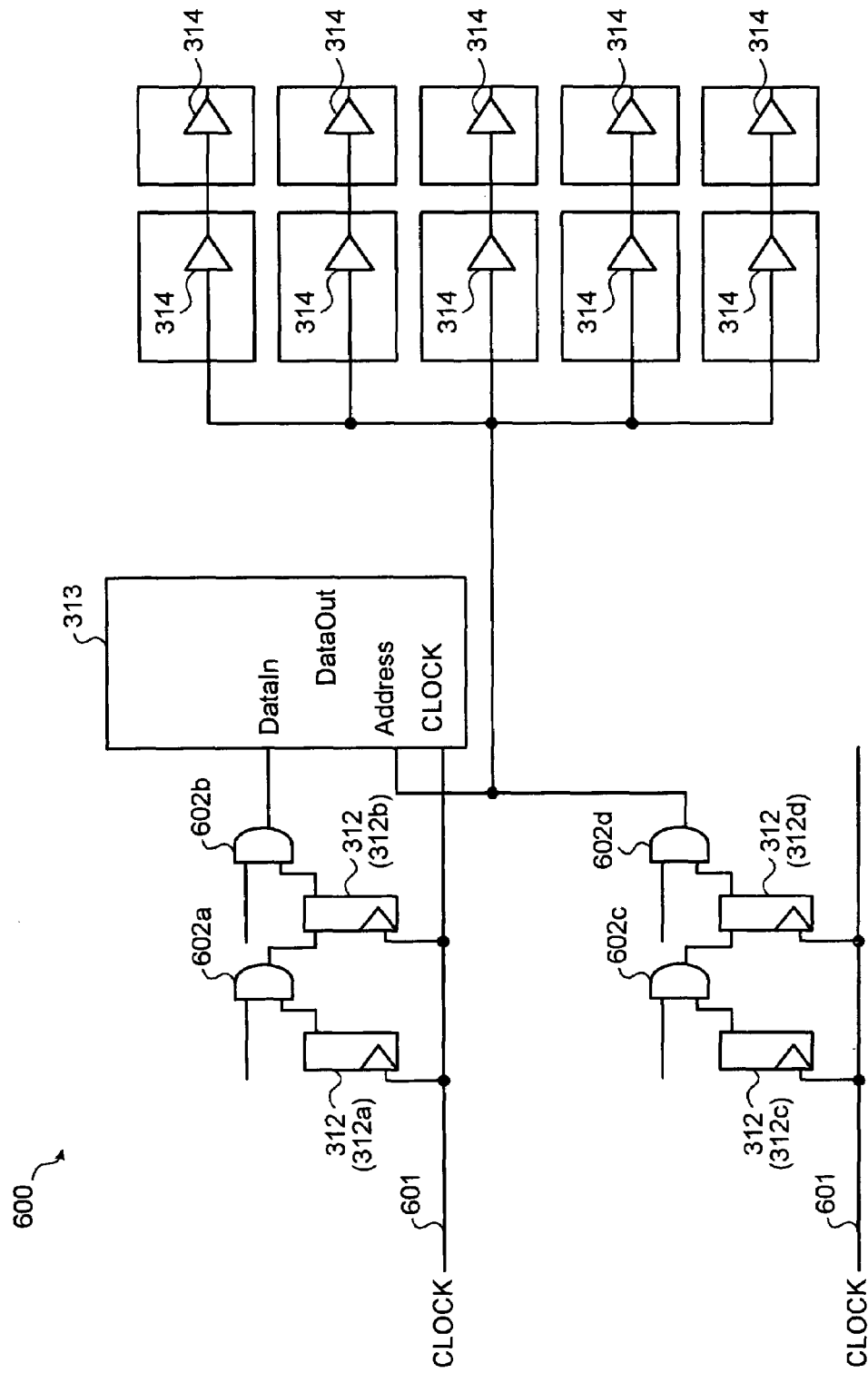
FIG. 10 is a block diagram of one example of a user net list stored in a user net list database.

The data contents stored in the databases 501 to 505, 507, and 508 shown in FIG. 9 are explained below. FIG. 10 is a block diagram of one example of a user net list 600 stored in the user net list database 501. The user net list 600 is created independently by a user, and it is created by referring to the logical information 310 in the user cell library 104. In FIG. 10, FFs 312 (312a to 312d) are connected to a clock line 601, and outputs from the FFs 312 (312a to 312d) are input to AND circuits 602a to 602d, respectively. The output from the upper AND circuit 602b is input into a data input terminal DataIn of the RAM 313, and the output from the lower AND circuit 602d is input into an address terminal Address of the RAM 313. Further, the output from the lower AND circuit 602d is input into respective BSRs 314.

Figure 11:
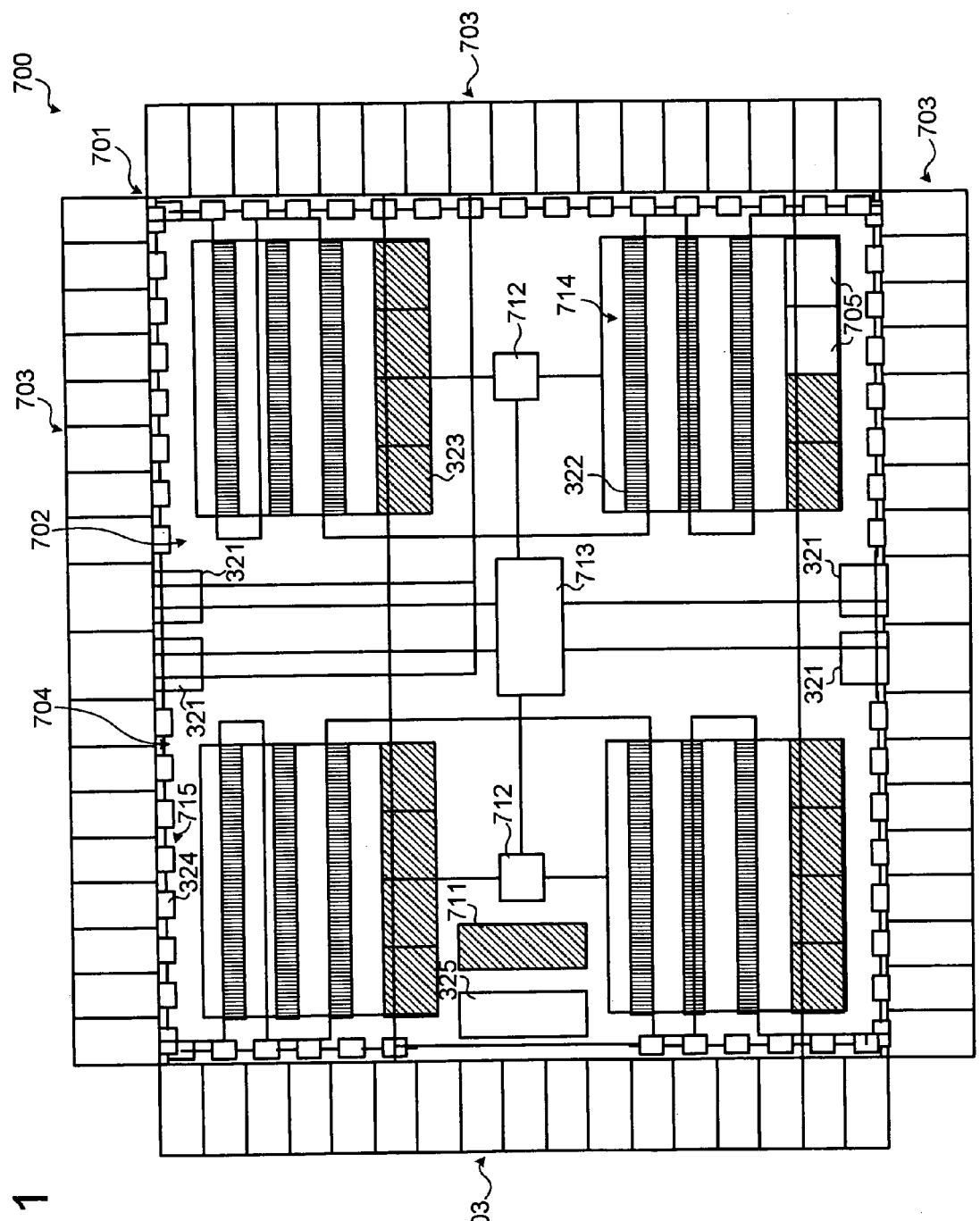
FIG. 11 is a block diagram of one example of a frame stored in a frame library database.
Figure 12:
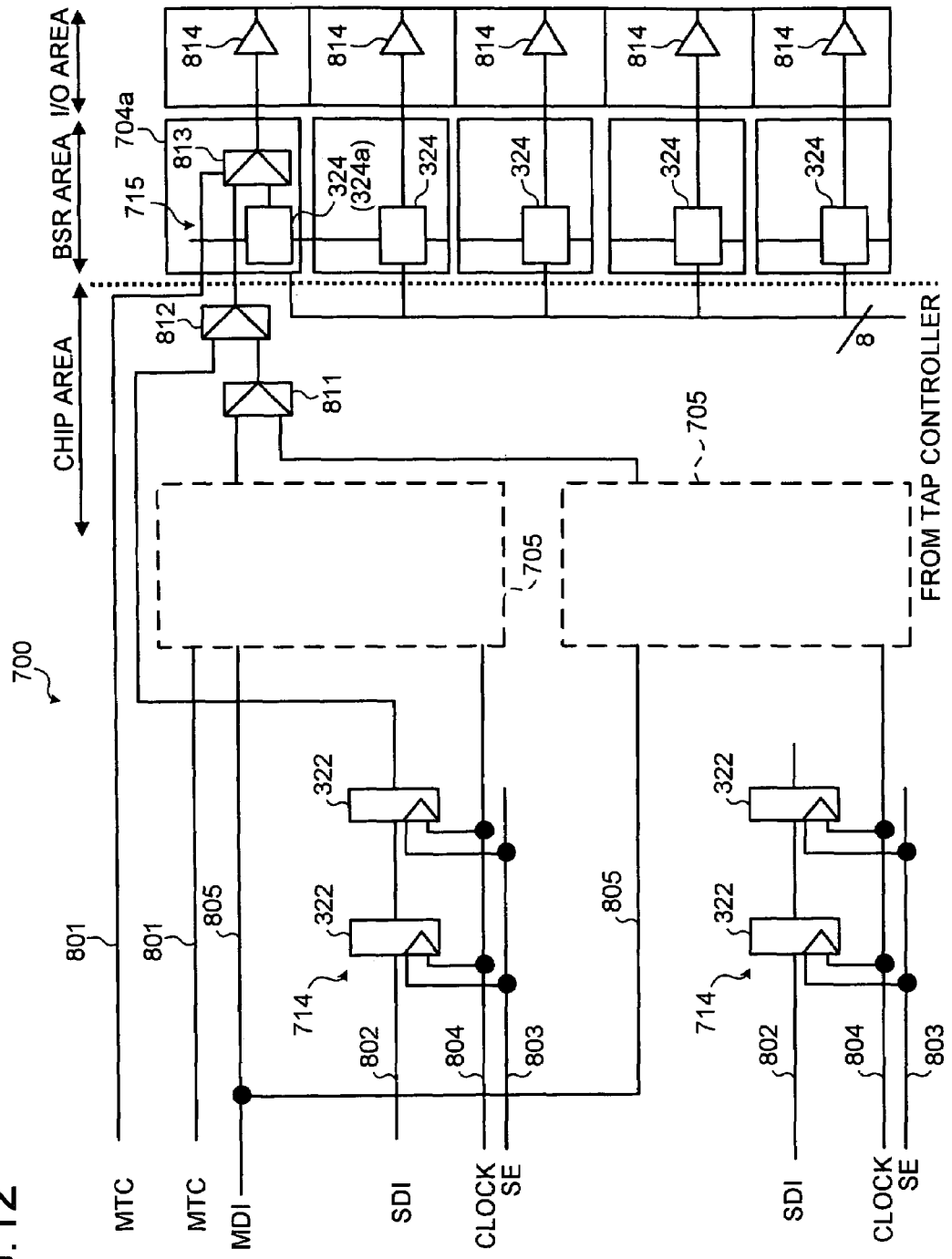
FIG. 12 is a partially enlarged diagram of the frame shown in FIG. 11.

The arrangement/wiring information of the frame stored in the frame library database 502 is explained below. FIG. 11 is a block diagram of one example of the arrangement/wiring information of the frame stored in the frame library database 502, and FIG. 12 is a partially enlarged diagram of the arrangement/wiring information of the frame shown in FIG. 11. This frame has the arrangement/wiring information of the hard macro cells with the test terminals and the test circuits. The arrangement/wiring information 700 of the frame is created based on the test cell library 105. In FIG. 11, the frame 701 has a chip area 702 into which the hard macro cells are embedded and an I/O area 703. A BSR area 704 is provided between the chip area 702 and the I/O area 703.

In FIG. 11, a memory test controller 711, a clock buffer 712, a switch box 713, the PLLs 321, a plurality of FFs 322, the RAM 323, and the TAP controller 325 are wired and connected in the chip area 702. The switch box 713 maps the outputs from the PLLs 321 on a source of a clock tree in the layout process. Further, the FFs 322 are wired and connected to each other so as to compose a scan chain 714. The RAM 323 is arranged on RAM arrangement areas 705.

In FIG. 12, in the scan chain 714, test wiring such as a macro test control line 801, a scan data input line 802, and a scan enable input line 803, and a clock line 804 are connected with one another. In the RAM arrangement areas 705, a macro test control line 801, an initializing signal line 805, and the clock line 804 are connected with one another as an input line. Further, output lines from the RAM arrangement areas 705 are connected to a selector 811, and an output line of the selector 811 and an output line of the upper scan chain 714 are connected to a selector 812.

In FIGS. 11 and 12, a plurality of BSRs 324 is arranged in one line on a periphery of the chip area in the BSR area 704, and are wired and connected so as to compose a boundary scan chain 715. Specifically, in FIG. 12, the BSRs 324 are connected with an output line from the TAP controller 325. In FIG. 12, a selector 813 which is connected to the macro test control line 801, the output line from the selector 812, and the output line from the BSR 324a is arranged in the top BSR area 704a. Buffers 814 which are connected to the BSRs 324 and the selector 813 are arranged in the I/O area 703.

Figure 13:
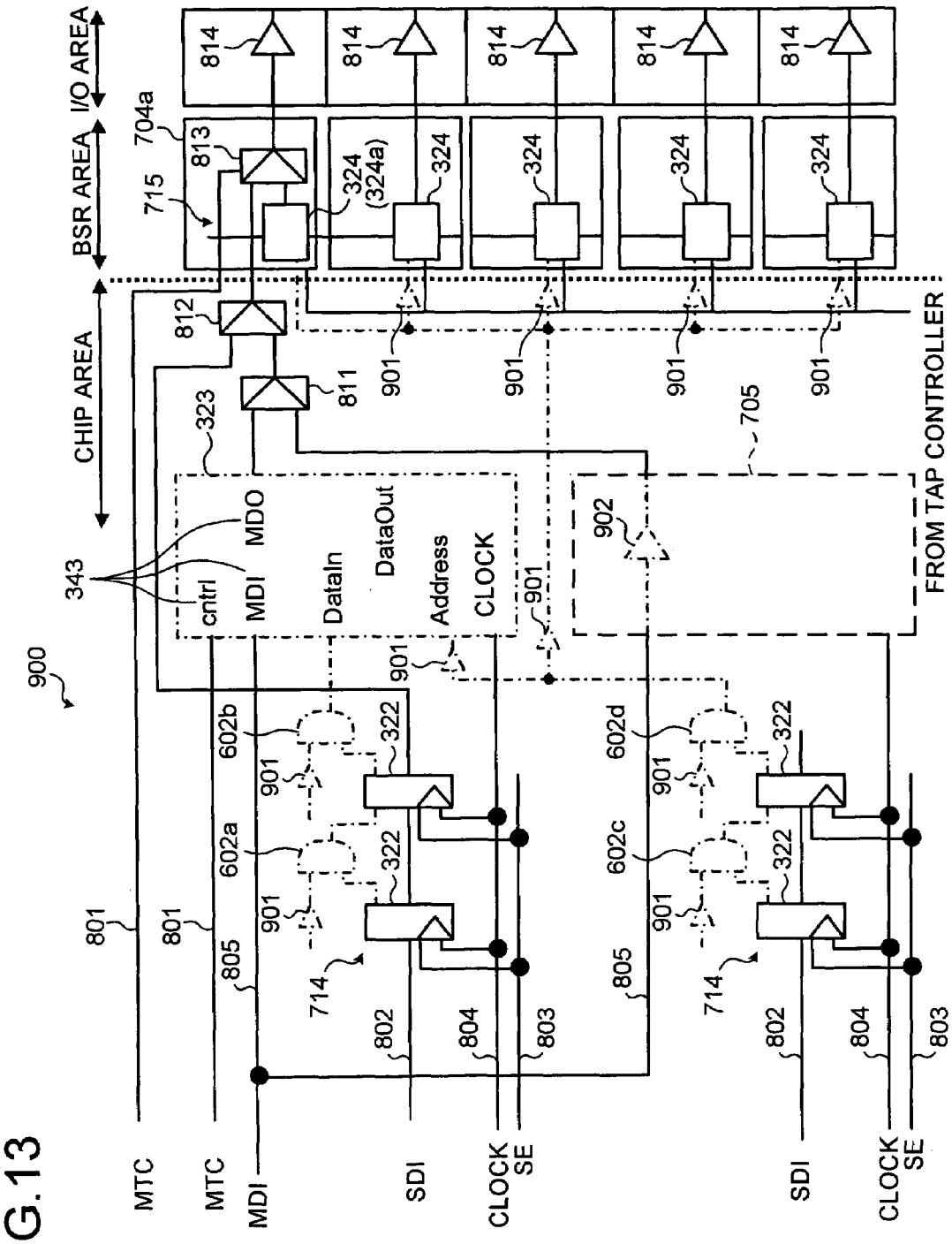
FIG. 13 is a block diagram of a net list after the user net list shown in FIG. 10 is laid out based on arrangement/wiring information of the frame shown in FIG. 12.

The net list, which is obtained by laying out the user net list 600 shown in FIG. 10 based on the arrangement/wiring information 700 of the frame shown in FIG. 12, is explained below. FIG. 13 is a block diagram of a net list 900 which is obtained by laying out the user net list 600 shown in FIG. 10 based on the arrangement/wiring information 700 of the frame shown in FIG. 12. In FIG. 13, the configuration indicated by an alternate long and short dash line is information that the arrangement and wiring are carried out from the user net list 600 based on the frame 700.

The RAM 323 is arranged on an output side of the upper AND circuit 602b in the user net list 600 shown in FIG. 10. Accordingly, also in FIG. 13, the RAM 323 is arranged on the output side of the upper AND circuit 602b. As to the RAM 323 shown in FIG. 13, since the physical information 320 in the user cell library 104 is referred to, the RAM 323, which has the test terminal 343 including a control input terminal cntrl, a macro test input terminal MDI, and a macro test output terminal MDO, is arranged. In FIG. 13, buffers 901 are suitably inserted. In the arrangement/wiring information 700 of the frame shown in FIG. 12, the RAM 323 is not arranged on the lower RAM arrangement area 705. Instead of the RAM 323, a buffer 902 is arranged on this portion.

Figure 14:
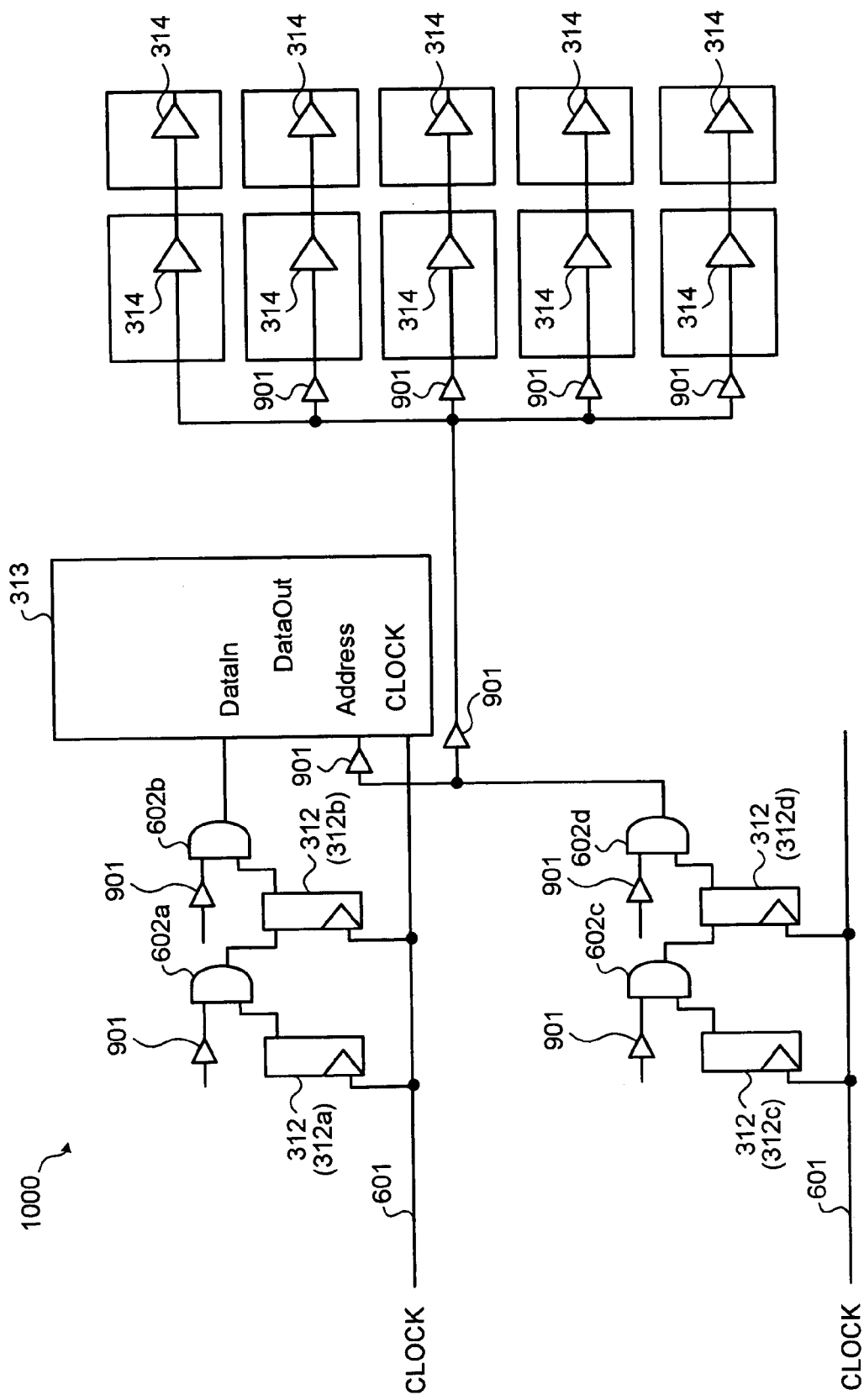
FIG. 14 is a block diagram of a net list stored in a return net list database in the process flow shown in FIG. 9.

The net list stored in the return net list database 508 in the process flow shown in FIG. 9 is explained below. FIG. 14 is a block diagram of the net list stored in the return net list database 508 in the process flow shown in FIG. 9. The net list 1000 shown in FIG. 14 is created from the net list 900 shown in FIG. 13 by referring to the logical information 310 in the user cell library 104. In FIG. 14, therefore, the selectors 811 to 813, and the test configuration such as the test wirings 801 to 803, and 805 shown in FIG. 13 can be removed. The BSRs 324 shown in FIG. 13 can be replaced by the BSRs 314, namely, buffers.

The I/F file stored in the I/F file database 503 in the process flow of FIG. 9 is explained below. FIGS. 15 to 21 are explanatory diagrams of description examples of the I/F file stored in the I/F file database 503 in the process flow of FIG. 9. In FIG. 15, an I/F file 1100 representing the connection information of the boundary scan chain is described. Specifically, the I/F file 1100 includes, for example, a connection order of the BSRs, the names of BSRs, the names of the input terminals, and the names of the output terminals.

In FIG. 16, an I/F file 1200 representing the connection information of the initializing signal line is described. Specifically, I/F file 1200 includes, for example, the names of RAM instances at connecting destination and the names of initializing signal input terminals of the RAMs. In FIG. 17, an I/F file 1300 representing the connection information of a result processing signal line is described. Specifically, the I/F file 1300 includes, for example, the names of the RAM instances to be connected and the names of the Initializing signal output terminals of the RAMs. Bit values in the I/F file 1300 are used when RAMs on which a test is conducted are selected.

In FIG. 18, an I/F file 1400 representing the connection information of a PLL monitor signal line is described.

Specifically, the I/F file 1400 includes, for example, the names of PLL instances to be selected by the bit values at the time of tests. In FIG. 19, an I/F file 1500 representing the connection information of the scan chain is described. Specifically, the I/F file 1500 includes, for example, the names of the cell instances composing the scan chain (for examples, the names of FF instances), the connecting order of the FFs composing the scan chain, the names of the input terminals for scan data, and the names of the output terminals for the scan data. In FIG. 20, an I/F file 1600 representing the connection information of a clock line (scan clock) is described. Specifically, the I/F file 1600 includes, for example, the instance names of the cells driven by the scan clock (for example, the names of the FF instances), and the names of the clock terminals.

In FIG. 21, an I/F file 1700 representing the connection information of a chip external terminal is described. Specifically, the I/F file 1700 includes, for example, the names of external input terminals connected to the initializing signal line described in the I/F file 1200 shown in FIG. 16, the names of external output terminals connected to the result process signal line described in the I/F file 1300 shown in FIG. 17, the names of external input terminals and external output terminals connected to the scan chain described in the I/F file 1500 shown in FIG. 19, and the names of external input terminals connected to the clock line (scan clock) described in the I/F file 1600 shown in FIG. 20.

Figure 22:
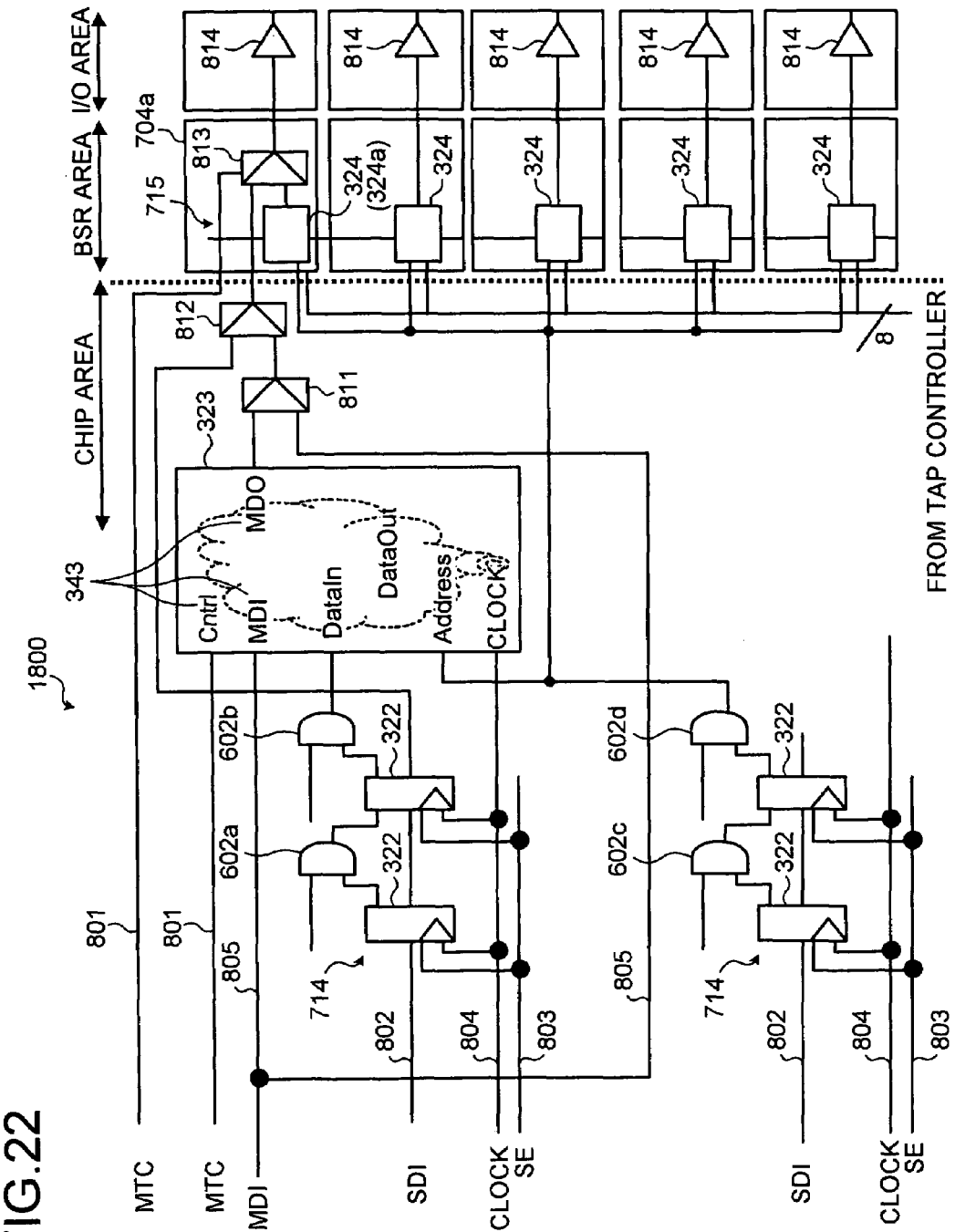
FIG. 22 is a block diagram of a test-synthesized net list stored in a test-synthesized net list database in the process flow shown in FIG. 9.

The test-synthesized net list stored in the test-synthesized net list database 504 in the process flow shown in FIG. 9 is explained below. FIG. 22 is a block diagram of the test-synthesized net list stored in the test-synthesized net list database 504 in the process flow shown in FIG. 9. The net list 1800 is created by test-synthesizing the user net list 600 based on the user net list 600 and the I/F files 1100 to 1700 shown in FIGS. 15 to 21. This net list is approximately equivalent to the arrangement/wiring information 900 after the layout shown in FIG. 13 in a logical manner. Since they are logically equivalent to each other, expectation values and output values of the logic test pattern, the RAM test pattern, and the PLL test pattern created by the net list 1800 are not different from each other even in the arrangement/wiring information 900 after the layout shown in FIG. 13.

The failure analysis net list stored in the failure analysis net list database 507 in the process flow shown in FIG. 9 is explained below. As to the failure analysis net list, the test terminals and the test circuits should be output. As the failure analysis net list can be created in a manner that the layout tool swaps the names of the hard macro cells in the user cell library 104 with the corresponding names of the hard macro cells in the test cell library 105 whose terminal configuration and specification on the physical information 320 are the same as those in the user cell library 104.

Functional Configuration of Design Support Apparatus

Figure 23:
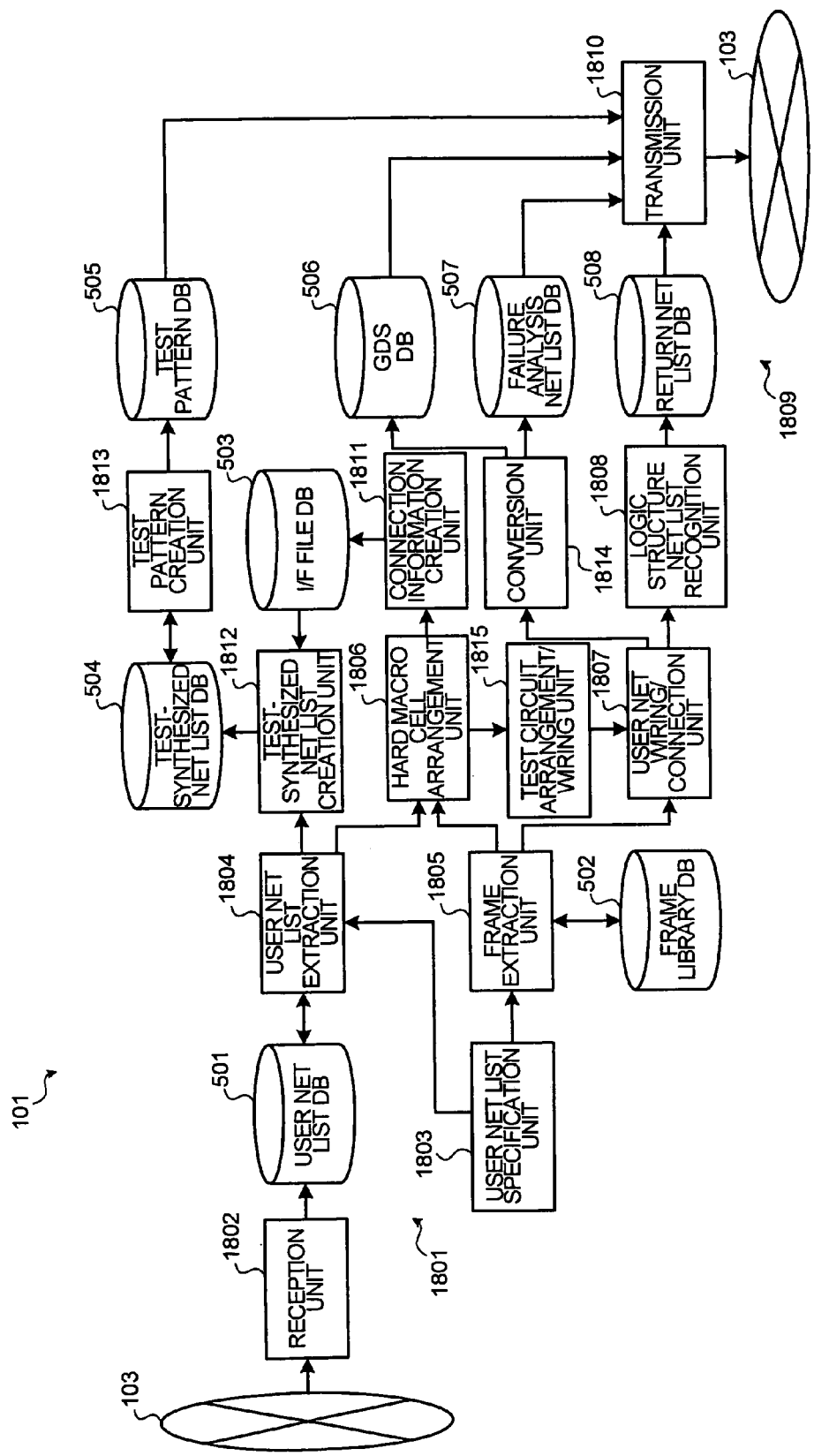
FIG. 23 is a block diagram of a functional configuration of the design support apparatus according to the embodiment of the present invention.

A functional configuration of the design support apparatus according to the embodiment of the present invention is explained below. FIG. 23 is a block diagram of the functional configuration of the design support apparatus according to the embodiment of the present invention. In FIG. 23, the design support apparatus 101 includes a user net list input unit 1801, a frame extraction unit 1805, a hard macro cell arrangement unit 1806, a user net wiring/connection unit 1807, a logic structure net list recognition unit 1808, a logic structure net list output unit 1809, a connection information creation unit 1811, a test-synthesized net list creation unit 1812, a test pattern creation unit 1813, a conversion unit 1814, and a test circuit arrangement/wiring unit 1815.

The user net list input unit 1801 inputs the user net list 600 created by the user using the hard macro cells excluding the test circuits 331 to 334 and the test terminals 341 to 345, namely, the hard macro cells 311 to 315 stored in the physical information 320 of the user cell library 104.

The user net list input unit 1801 includes a reception unit 1802, a user net list database 501, a user net list specification unit 1803, and a user net list extraction unit 1804. The reception unit 1802 receives the user net lists 600 transmitted from the information terminal devices 102 via the network 103. The user net list specification unit 1803 specifies an arbitrary user net list 600 from the user net lists stored in the user net list database 501. The user net list extraction unit 1804 extracts the arbitrary user net list 600 specified by the user net list specification unit 1803 from the user net list database 501.

When the specification is input from the user net list specification unit 1803, the frame extraction unit 1805 extracts the arrangement/wiring information 700 of the frame from the frame library database 502. The hard macro cell arrangement unit 1806 arranges the hard macro cells in the user net list 600 extracted by the user net list extraction unit 1804 based on the arrangement/wiring information 700 of the frame extracted by the frame extraction unit 1805. The hard macro cell arrangement unit 1806 corresponds to the layout (arrangement) of the process flow shown in FIG. 9 (step S501).

The test circuit arrangement/wiring unit 1815 arranges and wires the test circuits based on the wiring/arrangement information 700 of the frame. The test circuit arrangement/wiring unit 1815 corresponds to the layout (test circuit arrangement/wiring) in the process flow shown in FIG. 9 (step S504). The user net wiring/connection unit 1807 wires a net included in the user net list 600. The user net wiring/connection unit 1807 corresponds to the layout (user net wiring) in the process flow shown in FIG. 9 (step S505).

The logic structure net list recognition unit 1808 recognizes the logic structure net list 1000 excluding the arrangement/wiring information of the test circuits in the frame in the arrangement/wiring information 900 obtained by the user net wiring/connection unit 1807 (see FIG. 13). Specifically, the arrangement/wiring information of the test circuits in the arrangement/wiring information 700 of the test circuits in the frame is removed from the arrangement/wiring information laid out by using the physical information 320 in the user cell library 104. Thereafter, the logical information 310 in the user cell library 104 is referred to so that the net list is created.

The logic structure net list output unit 1809 outputs the net list 1000 of the logic structure recognized by the logic structure net list recognition unit 1808. The logic structure net list output unit 1809 includes the return net list database 508 and the transmission unit 1810. The return net list database 508 stores the net list 900 of the logic structure recognized by the logic structure net list recognition unit 1808 as the return net list.

The connection information creation unit 1811 creates connection information for connecting the hard macro cells in the user net list 600 with the test circuit arrangement/wiring information on the frame based on the arrangement/wiring information 700 of the test circuits on the frame and the result that the hard macro cell arrangement unit 1806 arranges the hard macro cells. The created connection information corresponds to the I/F files 1100 to 1700 shown in FIGS. 15 to 21.

The test-synthesized net list creation unit 1812 test-synthesizes the user net list 600 input by the user net list input unit 1801 by using the connection information created by the connection information creation unit 1811. As a result, the test-synthesized net list 1800 is created. The test-synthesized net list creation unit 1812 corresponds to the test synthesis (step S502) in the process flow shown in FIG. 9.

The test pattern creation unit 1813 creates a test pattern of the test-synthesized net list 1800 created in a manner that the test-synthesized net list creation unit 1812 test-synthesizes the user net list 600. Specifically, an input/output path of the test-synthesized net list is tracked, so that the test patterns including an input pattern and an output pattern is created. The test pattern creation unit 1813 corresponds to the test pattern creation in the process flow shown in FIG. 9 (step S503).

The conversion unit 1814 converts the names of the hard macro cells in the user cell library 104 used in the arrangement/wiring information 900 after the layout process into the names of the hard macro cells having the completely same terminal configuration and specification as those in the physical information in the test cell library 105. Further, when the net list including the arrangement/wiring information of the test circuits in the frame is output, the failure analysis net list having the same circuit configuration as that in the arrangement/wiring information 900 after the layout process can be output.

When an expectation value of the LSI tested by using the test pattern created by the test pattern creation unit 1813 is different from an output value from the LSI, a failure portion is analyzed by using the failure analysis net list created by the conversion unit 1814. In the failure portion analysis, in order to allow an internal logic in the hard macro cells to be analyzed, the hard macro cells are stored in the developed failure analysis net list database 507 in advance. Further, a delay of the chip is calculated, so that the operation in the hard macro cells can be analyzed by taking the delay value into consideration.

The transmission unit 1810 transmits the return net list stored in the return net list database 508, the test pattern stored in the test pattern database 505, the failure analysis net list stored in the failure analysis net list database 507, and the GDS data stored in the GDS database to the information terminal device 102 of the user who creates the user net list 600.

Figure 24:
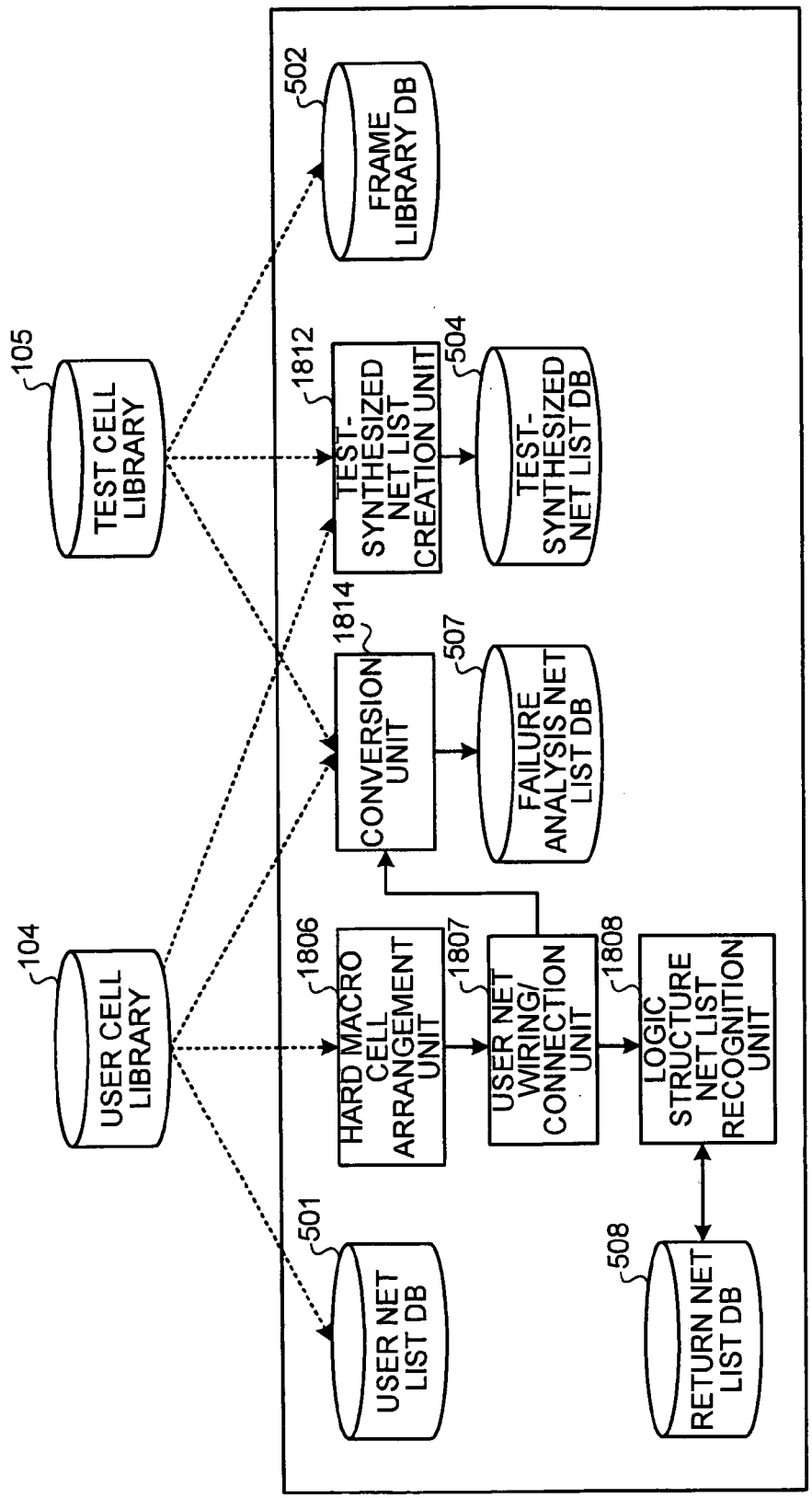
FIG. 24 is an explanatory diagram of a relationship among a partial functional configuration shown in FIG. 23, the user cell library, and the test cell library.

A relationship among the partial functional configuration and between the user cell library 104, the test cell library 105 are explained below. FIG. 24 is an explanatory diagram of a relationship among the partial functional configuration shown in FIG. 23, the user cell library 104, and the test cell library. In FIG. 23, the user net list database 501, the hard macro cell arrangement unit 1806, the user net wiring/connection unit 1807, the logic structure net list recognition unit 1808, and the return net list database 508 refer to the user cell library 104.

When the user net list database 501, the hard macro cell arrangement unit 1806, the user net wiring/connection unit 1807, the logic structure net list recognition unit 1808, and the return net list database 508 refer to the logical information 310, therefore, the hard macro cells do not include the test circuits and the test terminals. When they refer to the physical information 320, the hard macro cells include the test circuits and the test terminals. The conversion unit 1814 and the test-synthesized net list creation unit 1812 refer to both the user cell library 104 and the test cell library 105.

The test-synthesized net list database 504 and the frame library database 502 refer to the test cell library 105. The failure analysis net list database 507 refers to the test cell library 105 according to the swap process of the conversion unit 1814. When the test-synthesized net list database 504, the frame library database 502, and the failure analysis net list database 507 refer to any of the logical information 410 and the physical information 420, therefore, the hard macro cells include the test circuits and the test terminals.

The functions of the user net list input unit 1801, the frame extraction unit 1805, the hard macro cell arrangement unit 1806, the user net wiring/connection unit 1807, the logic structure net list recognition unit 1808, the logic structure net list output unit 1809, the connection/information creation unit 1811, the test-synthesized net list creation unit 1812, the test pattern creation unit 1813, the conversion unit 1814, and the test circuit arrangement/wiring unit 1815 can be realized as follows. Specifically, the functions can be realized in a manner that, for example, the CPU 201 executes the programs recorded in the ROM 202, the RAM 203, the HD 205, the FD 207, and the like shown in FIG. 6 or by the I/F 209.

The functions of the user cell library 104, the test cell library 105, the user net list database 501, the frame library database 502, the I/F file database 503, the test-synthesized net list database 504, the test pattern database 505, the GDS database 506, and the failure analysis net list database 507 are realized by, for example, the ROM 202, the RAM 203, the HD 205, the FD 207, and the like.

Design Process Procedure of the Design Support Apparatus

Figure 25:
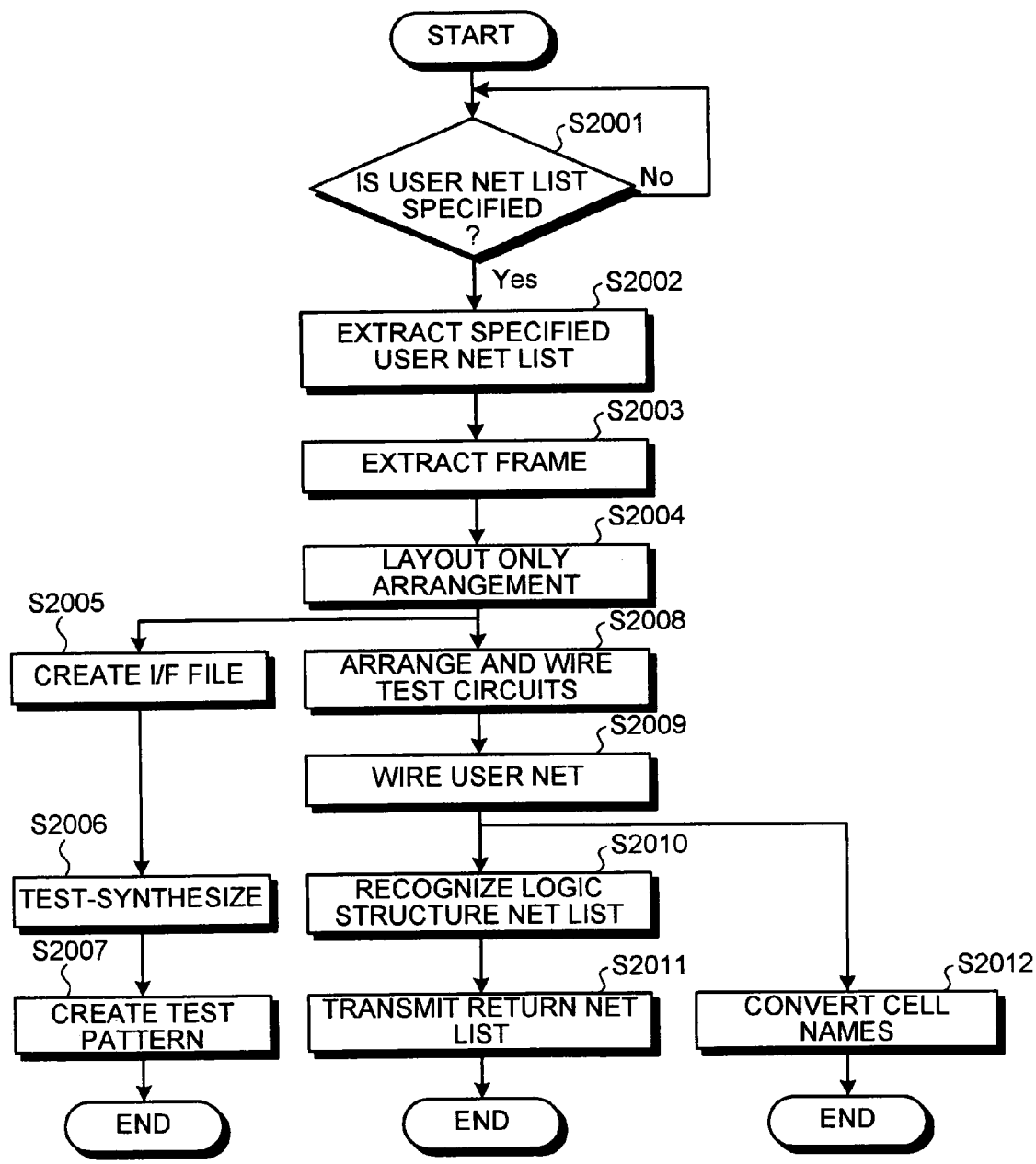
FIG. 25 is a flowchart of a design process procedure according to the embodiment of the present invention.

The design process procedure of the design support apparatus according to the embodiment of the present invention is explained below. FIG. 25 is a flowchart of the design process procedure according to the embodiment of the present invention. When the user net list 600 is specified (step S2001: Yes), the specified user net list 600 is extracted (step S2002), and the arrangement/wiring information 700 of the frame is extracted from the frame library database 502 (step S2003). The extracted user net list 600 is laid out based on the arrangement/wiring information 700 of the frame (step S2004).

Thereafter, the I/F files 1100 to 1700 are created (step S2005). The user net list 600 is test-synthesized by using the created I/F files 1100 to 1700 (step S2006). A test pattern is created from the test-synthesized net list 1800 created by the test synthesis (step S2007).

After the step S2004, the test circuits are arranged and wired (step S2008), and only the net of the user net list is wired (step S2009). In the net list 900 obtained by the arrangement and wiring, the logic structure net list 1000 excluding the test circuits is recognized (step S2010). The recognized logic structure net list 1000 is transmitted as the return net list (step S2011).

After the step S2009, the names of the hard macro cells in the arrangement/wiring information 900 after the layout process are converted from the cell names in the user cell library 104 into the names of the hard macro cells in the test cell library 105 having the completely terminal configuration and specification as those in the physical information (step S2012). The failure analysis net list obtained by the conversion process is output.

According to the design support processing procedure, the net list to be returned to a user and the test pattern can be created simultaneously and collaterally. As a result, a number of the steps and the design period can be reduced.

Simultaneous Tests of RAM

The simultaneous tests of the RAM are explained below. The RAM 323 including the test circuits which is subject to the hard macro process includes a bit selection circuit, a selection circuit and a comparison circuit composing the test circuit 333, and a core. Generally, a core name and a type of the test circuit to be put on the core can be specified by using the test synthesis tool in a database, test synthesis input file, or an execution option, not shown. When the database is referred to, the RAM 314 in the user net list 600 can be replaced by the RAM including the bit selection circuit, the test circuit 333, and the core.

Figure 26:
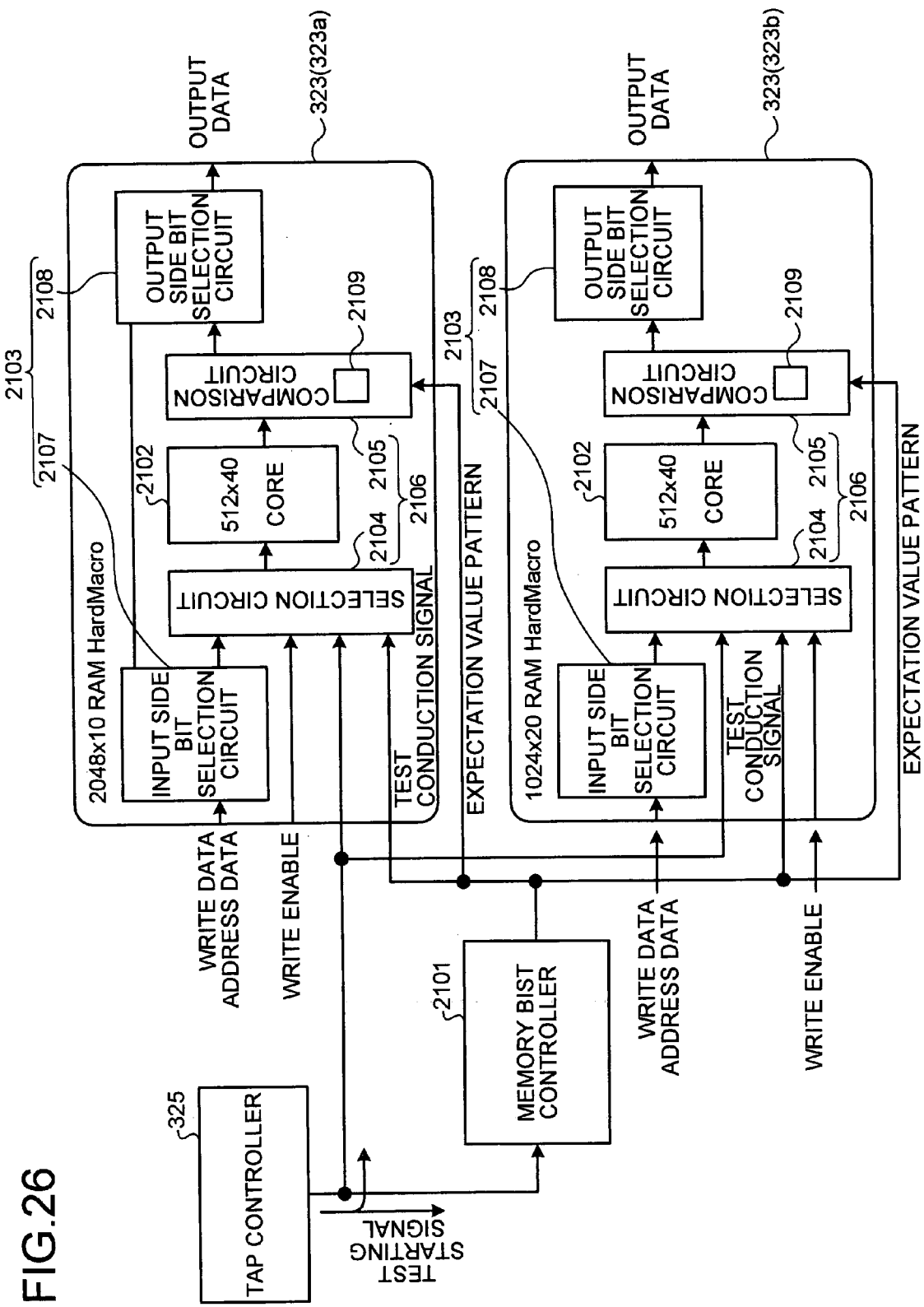
FIG. 26 is an explanatory diagram of a peripheral circuit necessary for RAMs including the test circuits subject to a hard macro process and for RAM tests.

The RAM including the test circuit which is subject to the hard macro process and a peripheral circuit necessary for the RAM test are explained below. FIG. 26 is an explanatory diagram of the peripheral circuit necessary for the RAM including the test circuits subject to the hard macro process and for the RAM test. A memory BIST (Built In Self Test) controller 2101 is initialized by an initializing signal, not shown, and starts the RAM test when a test starting signal from the TAP controller 325 becomes a trigger. A test conduction signal and an expectation value pattern are continued to be output to the respective RAMs at the time of the conduction of the test. The test conduction signal includes RAM input data necessary for controlling the RAMs at the time of the RAM test, address data, and write enable data.

The RAM 323 is explained. The RAMs 323 include a core 2102 for storing data therein, a bit selection circuit 2103, and a test circuit 2106 including n selection circuit 2104 and a comparison circuit 2105. The core 2102 is, for example, a random-access memory or the like, and its configuration here is 512 words×40 bits.

The bit selection circuit 2103 includes an input side bit selection circuit 2107 and an output side bit selection circuit 2108. The input side bit selection circuit 2107 converts a number of words in the input address data and a number of bits in write data to be input into a number of the words and a number of bits which are the same as those in the core 2102. The output side bit selection circuit 2108 converts a number of bits in read data output from the core 2102 into a number of bits in the write data to be input. Further, the upper RAM 323a is set in the hard macro cells having 2048 words and 10 bits by the bit selection circuit 2103. The lower RAM 323b is set in the hard macro cells having 1024 words and 20 bits by the bit selection circuit 2103.

The selection circuit 2104 selects a normal use mode and a test mode based on the test starting signal from the TAP controller 325 and the test execution signal from the memory BIST controller 2101. The comparison circuit 2105 having a register 2109 compares the expectation value pattern output from the memory BIST controller 2101 with the output pattern output from the core 2102 so as to store the compared result into the register. The comparison circuit 2105 outputs the compared result stored at the time of the test mode to the outside of LSI according to a result processing signal. In the normal use mode, data stored in the core 2102 are output.

Figure 27:
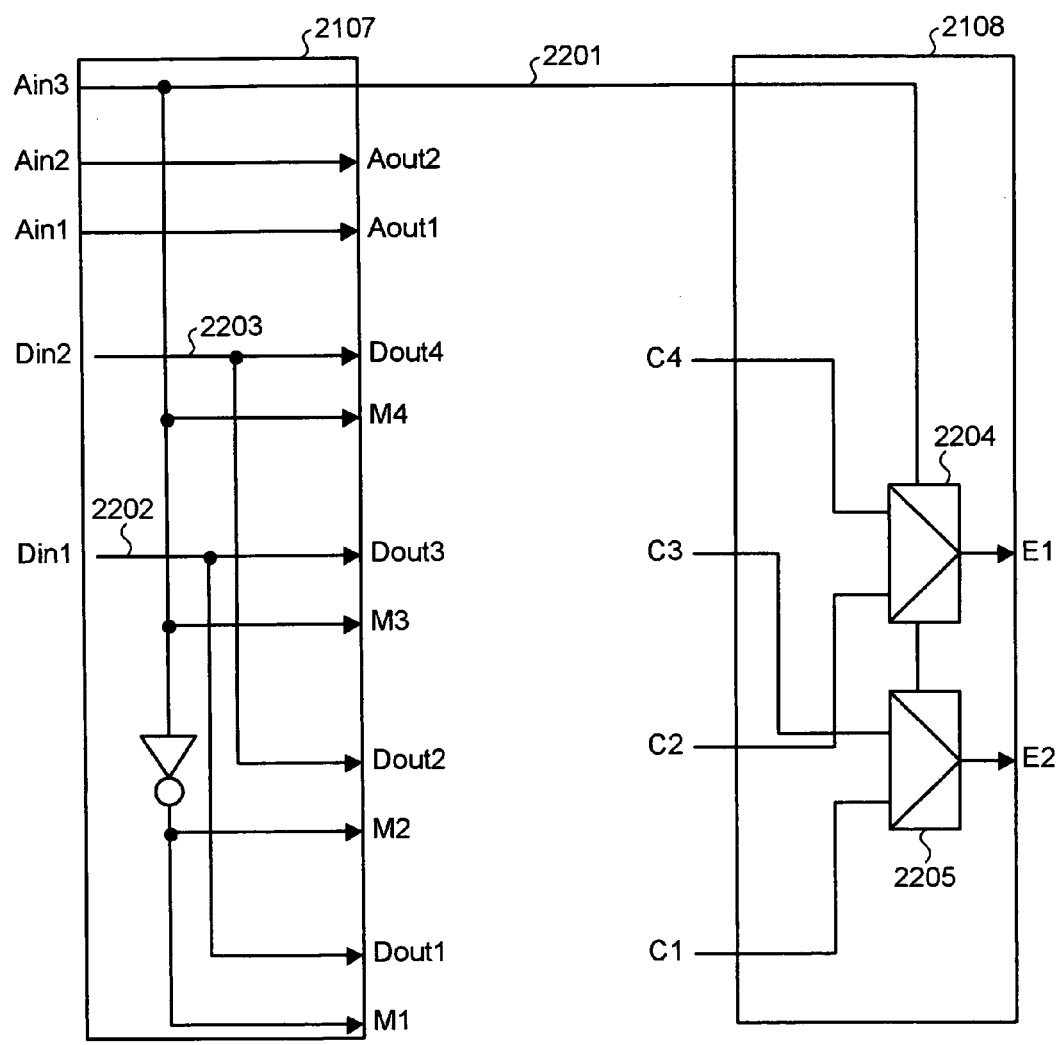
FIG. 27 is an explanatory diagram of one example of a bit selection circuit shown in FIG. 26.

One example of the bit selection circuit 2103 shown in FIG. 26 is explained below. FIG. 27 is an explanatory diagram of one example of the bit selection circuit 2103 shown in FIG. 26. In order to simplify the configuration, the example, in which the RAM 323 having a 8 words×2 bits configuration, and the core 2102 of the RAM 323 has a 4 words×4 bits, is explained.

The input side bit selection circuit 2107 has three address data input terminals Ain1 to Ain3 for inputting address data for 8 words, and two write data input terminals Din1 and Din2 for inputting write data for 2 bits. The input side bit selection circuit 2107 further has address data output terminals Aout1 and Aout2, write data output terminals Dout1 to Dout4, and mask terminals M1 to M4 as terminals to be connected to the selection circuit 2104. The address data input terminal Ain3 is connected to the output side bit selection circuit 2108 by an address data line 2201, and the other two address data input terminals Ain1 and Ain2 are connected to the address data output terminals Aout1 and Aout2.

A write data line 2202 at the write data input terminal Din1 is branched in the input side bit selection circuit 2107, and is connected from write data output terminals Dout1 and Dout3 to the core 2102 via the selection circuit 2104 shown in FIG. 26. Similarly, a write data line 2203 at the write data input terminal Din2 is also branched in the input side bit selection circuit 2107, and is connected from write data output terminals Dout2 and Dout4 to the core 2102 via the selection circuit 2104 shown in FIG. 26.

An address data line 2201 is branched in the input side bit selector circuit 2107, and is connected to the mask terminals M1 to M4. With the mask terminals M1 to M4, when the write enable is active, data are written into specified addresses, and when the write enable is inactive, data in specified addresses are maintained.

The output side bit selection circuit 2108 has four core output terminals C1 to C4 to be connected via the core 2102 and the comparison circuit 2105 shown in FIG. 26, and two selectors 2204 and 2205. The selector 2204 is connected to the two core output terminals C2 and C4 and the address data input terminal Ain3 of the input side bit selection circuit 2107. The selector 2205 is connected to the selector 2204. The selectors 2204 and 2205 are connected to data output terminals E1 and E2, respectively. As a result, data of 8 words×2 bits are output from the output side bit selection circuit 2108.

The cores 2102 having an identical bit/word configuration are embedded in advance, and the bit selection circuit 2103 can change the bit/word configuration of the cores 2102 according to a user's type of usage. The setting of the bit selection circuit 2104 is changed at that time of the test mode, and the identical bit/word configurations using the entire memory cell areas are treated. As a result, the simultaneous tests can be conducted in the arbitrary cores 2102 without taking a difference in the bit/word configurations into consideration, so that the test period can be shortened. Further, the applicable scope of the simultaneous tests is widened, so that the test circuits can be commoditized efficiently.

Figure 28:
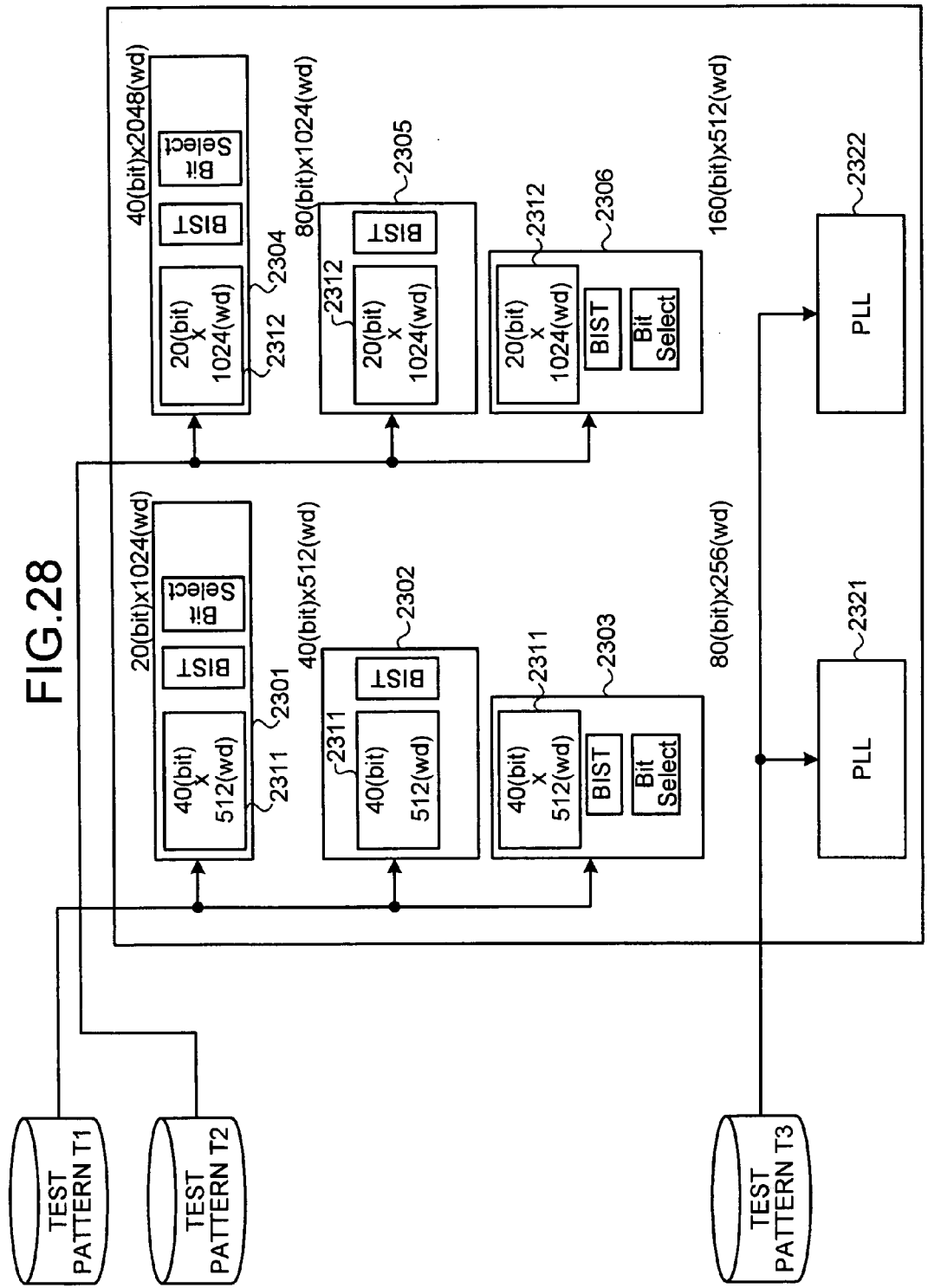
FIG. 28 is an explanatory diagram of a principle of an identical test pattern.

The creation of an identical test pattern is explained below. FIG. 28 is an explanatory diagram of a principle of the identical test pattern. In FIG. 28, three types of test patterns T1 to T3 are created by the test pattern creation. RAMs 2301 to 2303 have different bit/word configurations, but include the cores 2311 having the identical bit/word configurations. Accordingly, the test pattern T1 used for the RAM 2301 can be applied also to the RAMs 2302 and 2303.

Similarly, RAMs 2304 to 2306 have different bit/word configurations, but include the cores 2312 having the identical bit/word configurations. Accordingly, the test pattern T2 used for the RAM 2304 can be applied also to the RAMs 2305 and 2306. Further, PLLs 2321 and 2322 have an identical type of internal circuits, so that the test pattern T3 can be applied to both of them.

As a result, when the cores having the identical bit/word configurations are embedded into the RAM hard macro in advance, the test pattern can be reused. A number of the steps of creating the test pattern can be reduced, and the time for creating the test pattern can be shortened.

(Different Types of BSRs having Identical Test Terminal Configuration)

Figure 29:
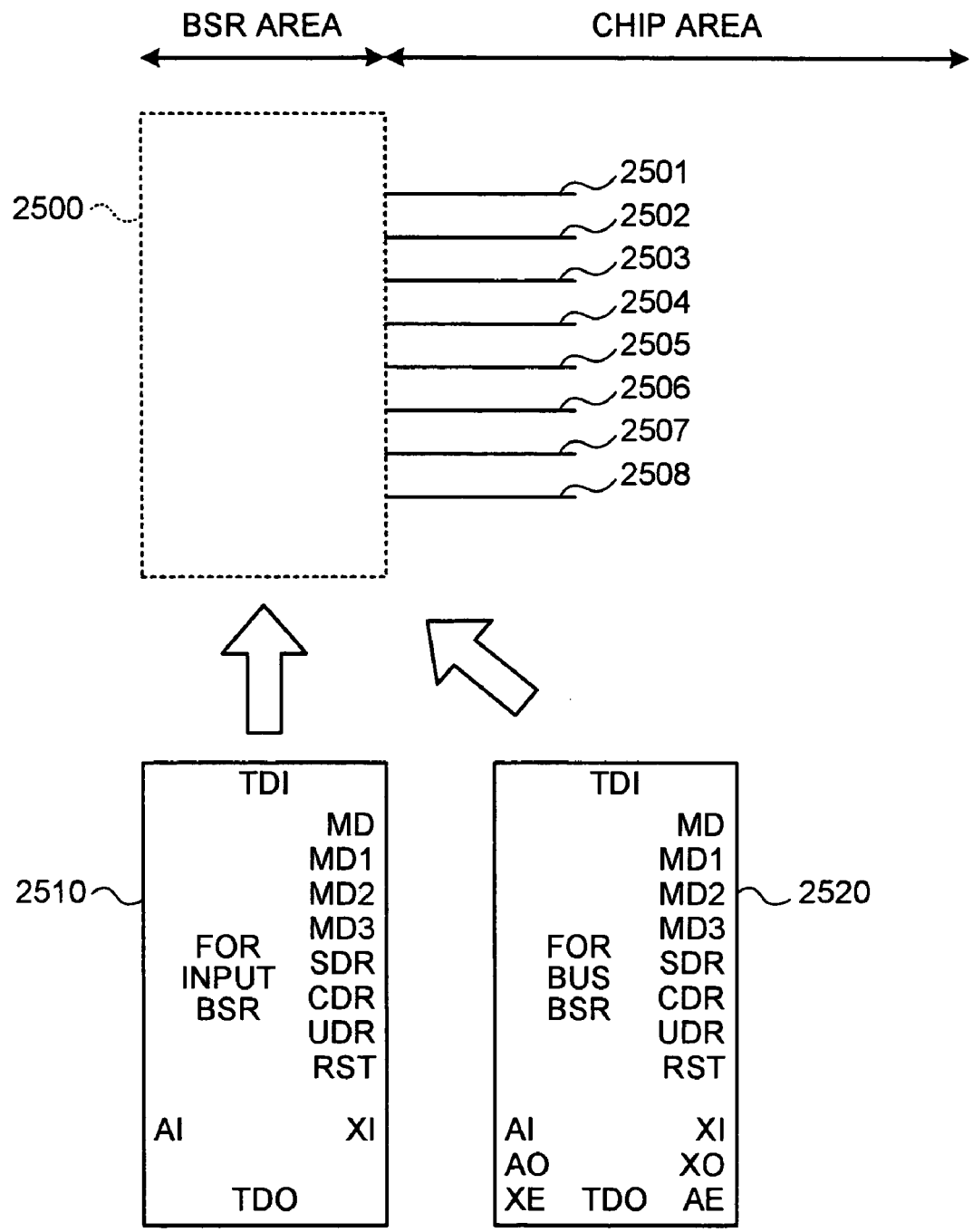
FIG. 29 is an explanatory diagram of an example that BSRs having a test terminal configuration are inserted into a BSR area.

An example that BSRs having the test terminal configuration are inserted into the BSR area is explained below. FIG. 29 is an explanatory diagram of the example that the BSRs having the test terminal configuration are inserted into the BSR area. In FIG. 29, control signal lines 2501 to 2508 from the TAP controller, not shown, are embedded into a chip area of the frame. A BSR arrangement area 2500 into which BSRs can be inserted is provided on the frame.

Different types of BSRs having the identical test terminal configuration can be arranged on the BSR arrangement area 2500. In FIG. 29, as one example, any of an input BSR 2510 and a bus BSR 2520 can be arranged on the BSR arrangement area 2500. Specifically, both the input BSR 2510 and the bus BSR 2520 include test terminals of MD, MD1, MD2, MD3, SDR, CDR, UDR, and RST.

When the input BSR 2510 or the bus BSR 2520 is arranged on the BSR arrangement area 2500, the test terminal MD is connected to the control signal line 2501, and the test terminal MD1 is connected to the control signal line 2502. The test terminal MD2 is connected to the control signal line 2503, the test terminal MD3 is connected to the control signal line 2504, and the test terminal SDR is connected to the control signal line 2505. The test terminal CDR is connected to the control signal line 2506, the test terminal UDR is connected to the control signal line 2507, and the test terminal RST is connected to the control signal line 2508.

When the test terminals necessary for the input BSR 2510 are determined as MD, SDR, CDR, and UDR, and the test terminals necessary for the bus BSR 2520 is determined as MD, MD1, MD2, MD3, SDR, CDR, UDR, and RST, the test terminals MD1, MD2, MD3, SDR, CDR, and UDR unnecessary for the input BSR 2510 are provided in the input BSR 2510. As a result, the test terminal configuration of the input BSR 2510 is aligned with the test terminal configuration of the bus BSR 2520, so that any of the BSRs can be arranged on the BSR arrangement area 2500 regardless of applications of the BSRs. As a result, the flexibility in design can be improved.

In FIG. 29, the test terminal configurations of the input BSR 2510 and the bus BSR 2520 are aligned with each other, but also an output BSR, a 3-STATE BSR, a clock BSR, and a cell to be inserted at the time of not using the BSRs may have the same test terminal configuration as that of the input BSR 2510 and the bus BSR 2520. The test terminal configurations of a shared input/scan-in BSR and a cell to be inserted at the time of scan-in may be aligned with each other. Further, the test terminal configurations of a shared input/scan-out BSR and a cell to be inserted at the time of scan-out may be aligned with each other.

Boundary Scan Chain where Bypass Cells are Inserted into the BSR Area

Figure 30:
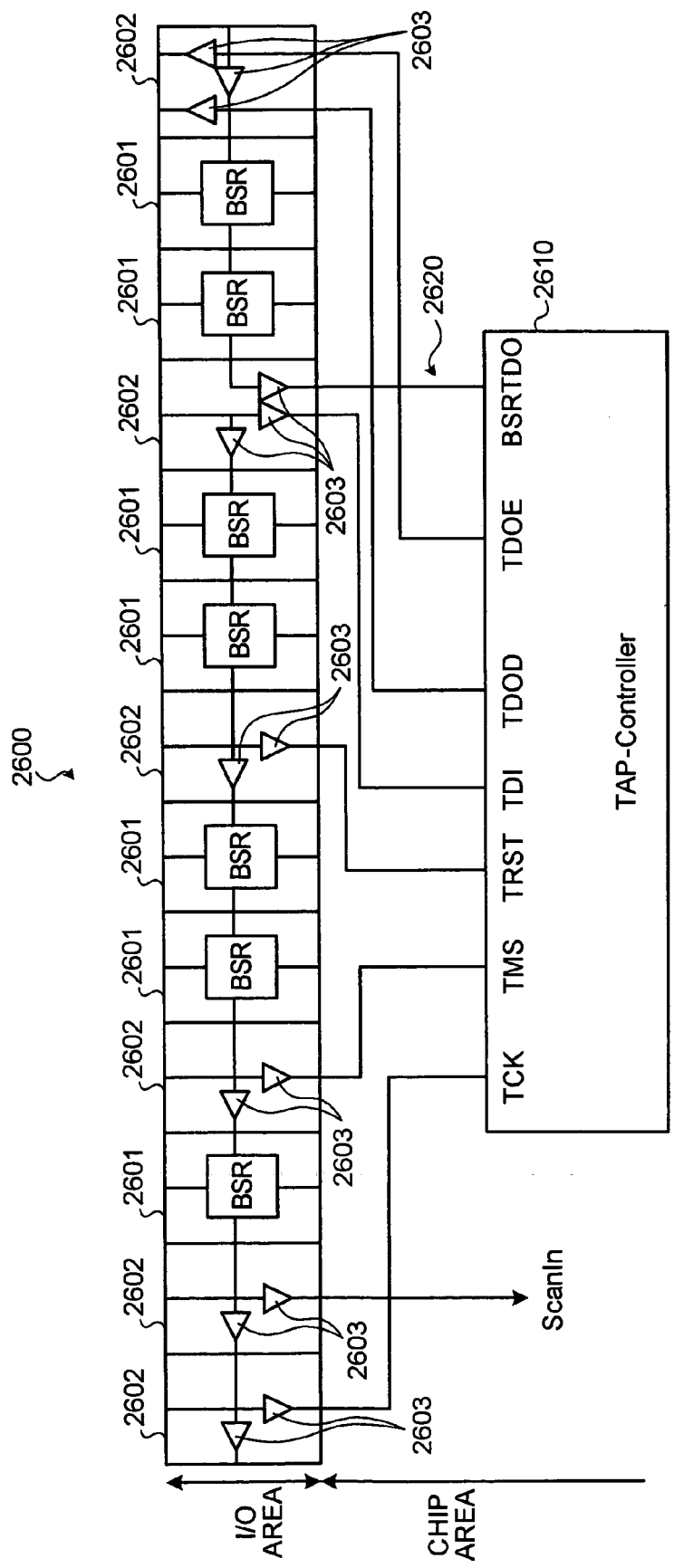
FIG. 30 is an explanatory diagram of a boundary scan chain where bypass cells are inserted into the BSR area.

The boundary scan chain where bypass cells are inserted into the BSR area is explained below. FIG. 30 is an explanatory diagram of the boundary scan chain where the bypass cells are inserted into the BSR area. In FIG. 30, the boundary scan chain 2600 includes BSR cells 2601 having BSRs and bypass cells 2602. The bypass cells 2602 have one or a plurality of buffer(s). The buffer 2603 is connected to the adjacent BSR cell 2601 or bypass cell 2602, and is connected to a TAP controller 2610 via a control signal line 2620.

Figure 1:
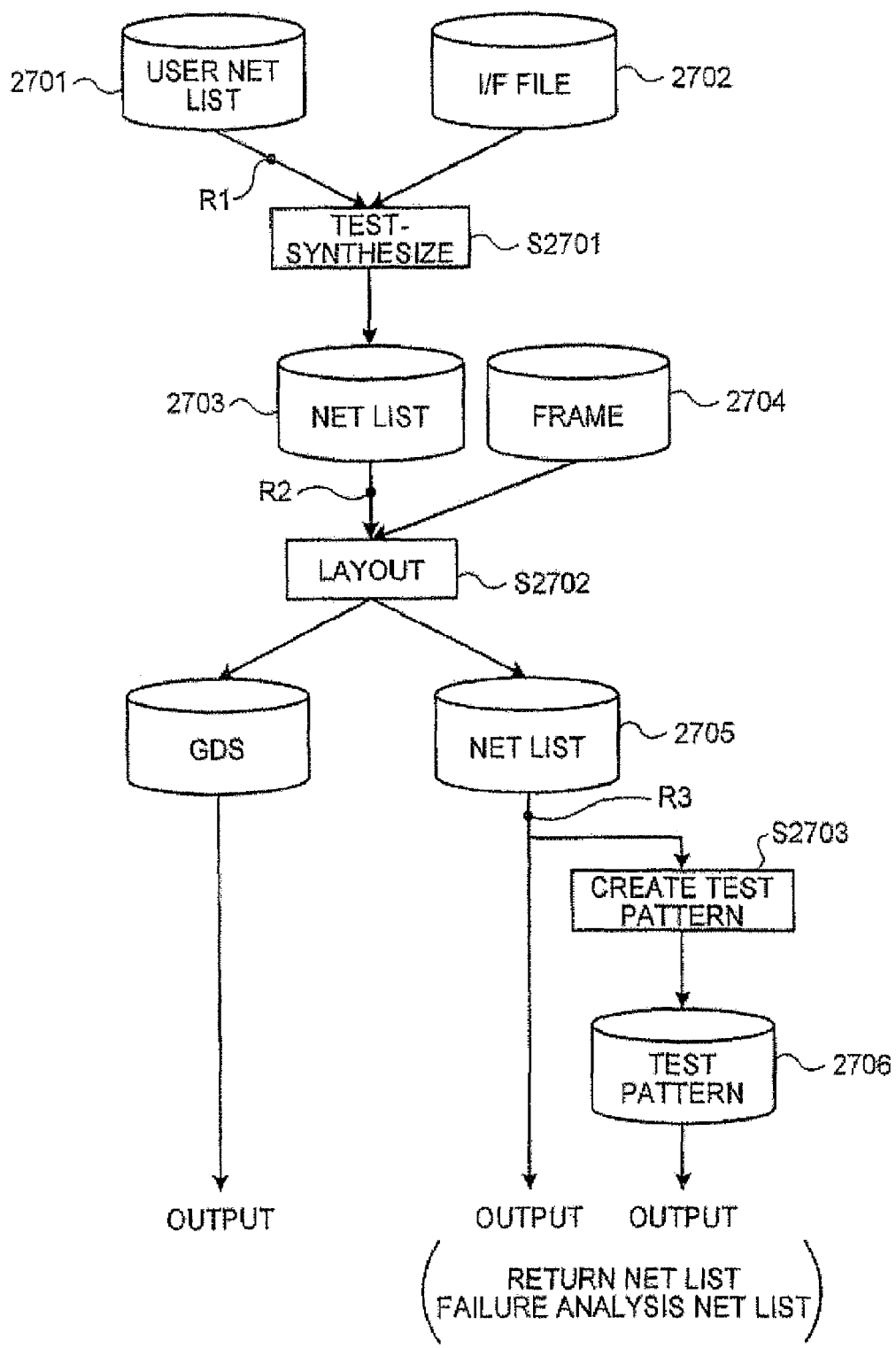
FIG. 1 is an explanatory diagram of one example of a conventional design flow.
Figure 2:
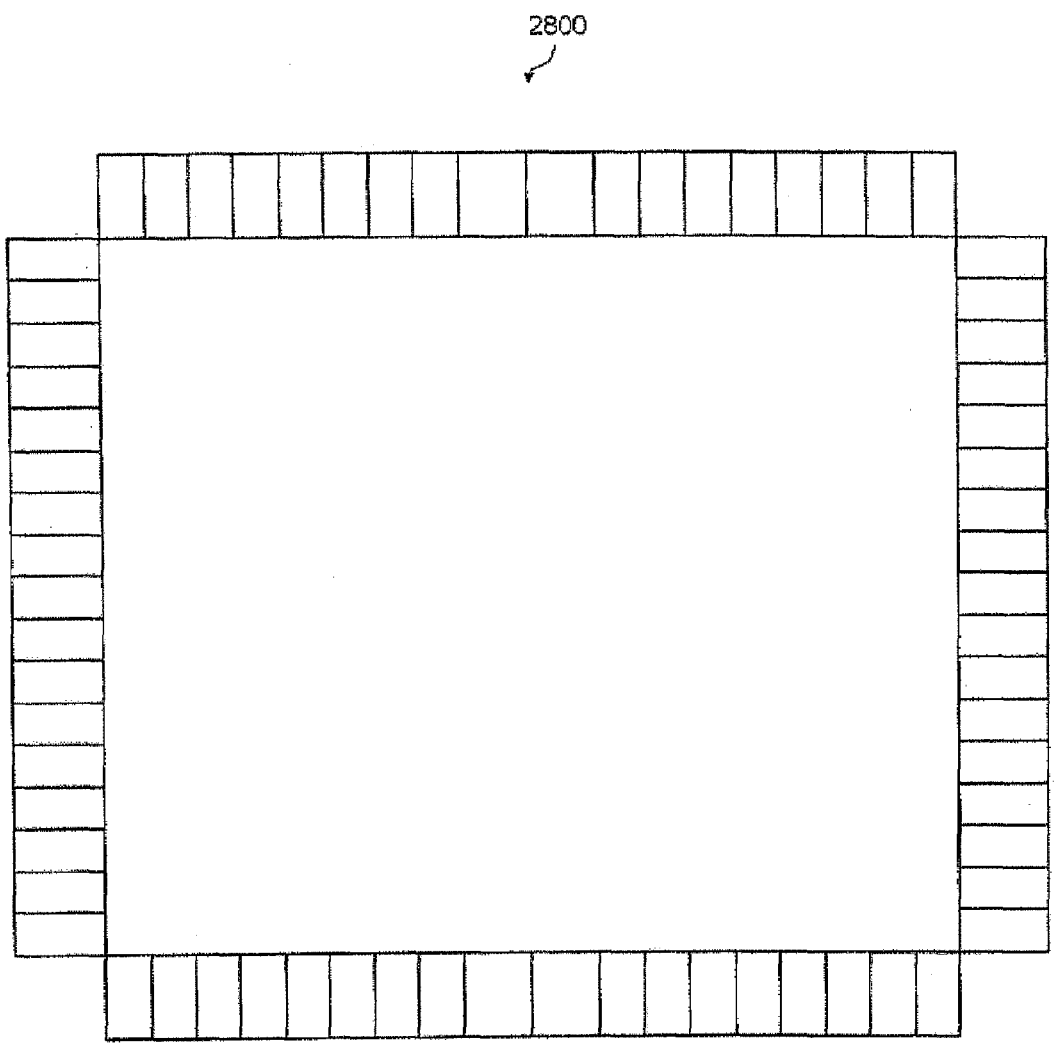
FIG. 2 is an explanatory diagram of a conventional frame.
Figure 3:
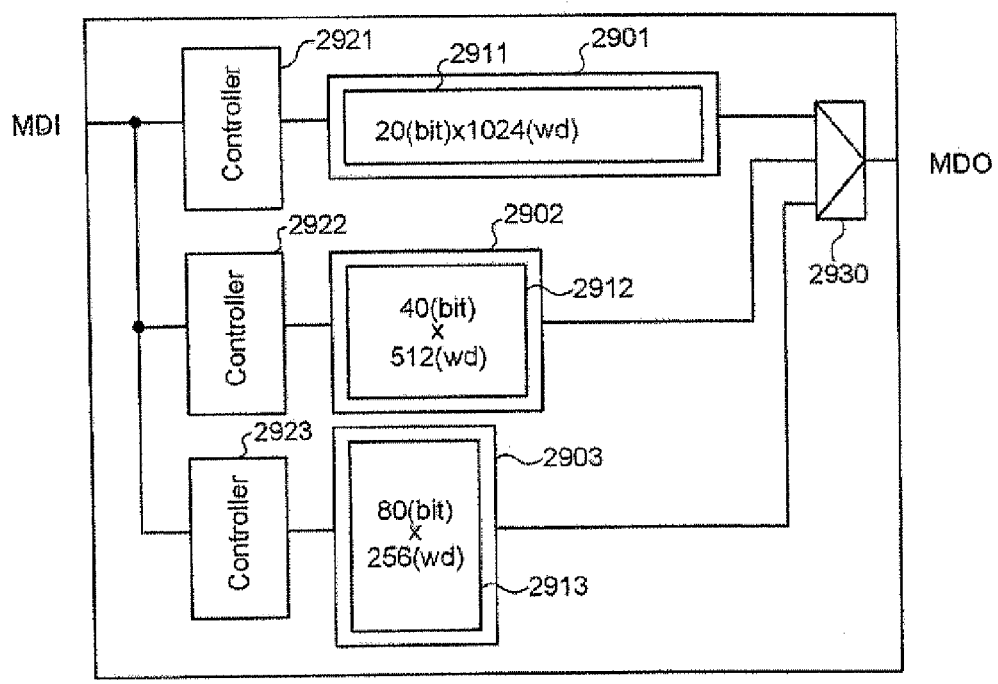
FIG. 3 is an explanatory diagram of a state that a plurality of RAMs is laid out on the conventional frame.
Figure 4:
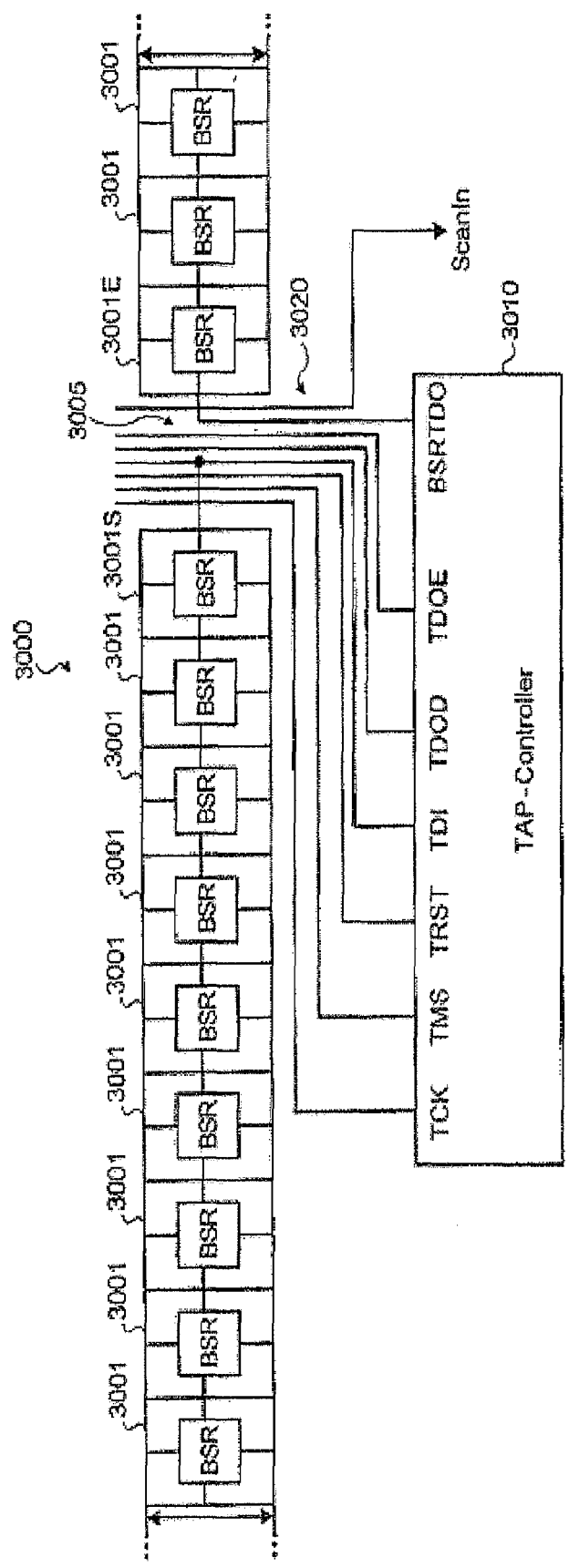
FIG. 4 is an explanatory diagram of a boundary scan chain formed by sequentially arranging BSRs.

When the bypass cells 2602 are inserted into the boundary scan chain 2600, the cut area 3005 shown in FIG. 4 is not formed, so that the cut area 3005 is not excessively occupied by a control signal line of the TAP controller 3010 and a test signal line 3020. As shown in FIG. 30, therefore, the control signal line 2620 of the TAP controller 2610 is dispersed in the respective bypass cells 2602, so that the flexibility in design can be improved.

According to the design support apparatus in the embodiment of the present invention, the test circuits and the test terminals are inserted into the hard macro cells in advance, and the timing-converged hard macro cells are used. Accordingly, a number of the logic design steps can be reduced, thereby shortening the design period and making the design work more efficient. Further, it is not necessary to insert the test circuits after the contents of the test-synthesized layout are taken into consideration, so that the flexibility in design can be improved.

Since the logic is designed by using the hard macro cells excluding the test terminals in which the timing of the internal test circuits is taken into consideration, it is not necessary to again timing-converge the user net list. As a result, the design period can be shortened by reducing a number of the logic design steps. Further, even when the condition of the test synthesis is largely different from the actual arrangement status, an increase in the wiring length and a reduction in the test operating frequency due to the increase in the wiring length can be prevented.

The interface file created at the time when the arrangement of the layout is ended is used, and the test synthesis through the test pattern creation can be carried out along with the wiring process of the layout. Accordingly, the design period can be shortened. Further, the frame library is prepared in advance, so that a number of rule check times is reduced, and a number of the logic design steps can be reduced. As a result, the design period can be shortened, and the design work can be more efficient.

When cores of a plurality of RAMs having identical bit/word configurations are used, even if the RAMs have different bit/word configurations, the simultaneous tests can be conducted and the test pattern can be reused. As a result, the test period can be shortened.

When different types of BSRs have the identical test terminal configurations, the BSR can be arranged regardless of applications. Accordingly, the flexibility in design can be improved and the design work can be more efficient.

Two BSR cells are connected in the arrangement area between two arbitrary BSR cells in the boundary key chain formed by a plurality of BSR cells, and the bypass cells for connecting the signal line passing through the arrangement area are arranged. As a result, the flexibility of the arrangement of the TAP controller and the wiring of its signal line can be improved.

The design support method explained in the embodiment can be realized in a manner that a computer such as a personal computer or a work station executes a prepared program. This program is recorded in a recording medium such as a hard disc, a flexible disc, a CD-ROM, an MO, or a DVD which is readable by the computer. The computer reads the program from the recording medium so that the program is executed. The program may be a transmission medium which can be distributed via a network such as the Internet.

According to the design support apparatus, the design support method, the design support program, and the recording medium of the present invention, the design period can be shortened and the work of the designer can be reduced, so that the design work can be more efficient. Particularly, the test circuits and the test terminals are inserted into the hard macro cells in advance, and the timing-converged hard macro cells are used. Accordingly, a number of the logic design steps can be reduced, so that the design period can be shortened and the design work can be more efficient. Further, it is not necessary to insert the test circuits after the contents of the test-synthesized layout are taken into consideration, so that the flexibility in design can be improved.

Since the logic is designed by using the hard macro cells not including the test terminals where the timing of the internal test circuits is taken into consideration, it is not necessary to again timing-converge the user net list. As a result, a number of the logic design steps is reduced so that the design period can be shortened. Further, when the test synthesis condition is largely different from an actual arrangement status, an increase in the wiring length and a reduction in the test operating frequency due to the reduction can be prevented.

The interface file created at the stage when the arrangement of the layout is ended is used, and the test synthesis through the test pattern creation can be processed together with the wiring process of the layout. Accordingly, the design period can be shortened. Further, when the frame library is prepared, a number of rule check times are reduced and a number of the logic design steps can be reduced. As a result, the design period can be shortened, allowing the design work to be more efficient.

When the cores of the RAMs having the identical bit/word configurations are used, even if the RAMs have different bit/word configurations, the simultaneous tests can be conducted and the test pattern can be reused. As a result, the test period can be shortened.

When different types of BSRs have the identical test terminal configurations, the the BSRs can be arranged regardless of applications. Accordingly, the flexibility in design can be improved and the design work can be more efficient.

Two arbitrary BSR cells are connected on the arrangement area between the two BSR cells in the boundary scan chain formed by the BSRs sequentially arranged in the BSR area, and the bypass cells which connect the signal line passing through the arrangement area are arranged. As a result, the flexibility of the arrangement of the TAP controller, and the wiring of its signal line and its test signal line can be improved. In order to solve the problems and achieve the above object, the present invention provides a design support apparatus, a design support method, a design support program and a recording medium, wherein a frame, which includes arrangement/wiring information of hard macro cells having test terminals in timing-converged physical information and test circuits, is stored, a user net list without test circuits is input by using hard macro cells which have physical information of the same terminal configuration as that of the hard macro cells and do not have a test terminal in logical information, the stored frame is extracted, and the hard macro cells included in the input user net list are arranged based on the arrangement/wiring information of the test circuits included in the extracted frame.

According to the present invention, the hard macro cells including the test terminal in the physical information and the test circuits is provided on the frame and are timing-converged. Accordingly, the hard macro cells in the input user net list can be arranged before test synthesis according to the arrangement/wiring information of the test circuits in the hard macro cells on the frame.

The hard macro cells and the test circuits in the user net list input based on the arrangement/wiring information of the test circuits on the frame are arranged and wired, and a user net in the input user net list is wired. Thereafter, arrangement/wiring information of the test circuits on the frame is removed from the arrangement/wiring information, and a net list not including the test circuit may be output.

According to the present invention, it is not necessary to make a design after the insertion of the test circuits at the time of test synthesis is taken into consideration, and a number of the design steps can be reduced without affecting the flexibility in design. Further, a desired net list can be provided to a user without having the user bothered by wiring/connection of the test terminals of the hard macro cells and the test circuits.

The hard macro cells in the input user net list are arranged based on the arrangement information of the frame, and connection information about the connection between the hard macro cells and the test circuits on the frame is created based on the arrangement/wiring information of the test circuits and the hard macro cells on the frame. The user net list is test-synthesized based on the created connection information, so that the test-synthesized net list is created. In such a manner, a test pattern of the created test-synthesized net list may be created.

According to the present invention, the connection information about the connection can be automatically created based on the arrangement/wiring information of the test circuit and the hard macro cells on the frame. Further, the test pattern can be created independently from and along with the wiring of the user net, so that a number of the design steps can be reduced.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An apparatus supporting designing of a large scale integrated (LSI) circuit, the apparatus comprising:
   a user net list extraction unit that extracts a user net list from a user net list database wherein the user net list includes hard macro cells;
   a frame extraction unit that extracts a frame from a frame library database wherein the frame includes test circuits and is timing converged;
   a hard macro cell arrangement unit that arranges the hard macro cells on the frame;
   a connection information creation unit that creates connection information for connecting the hard macro cells and the test circuits; and
   a test-synthesized net list creation unit that creates a test-synthesized net list by test-synthesizing the user net list based on the connection information.

2. The apparatus according to claim 1, further comprising:
   a test circuit arrangement and wiring unit that arranges and wires test circuits;
   a user net wiring and connection unit that wires net included in the user net list;
   a logic structure net list recognition unit that creates a logic structure net list by excluding test circuits from a result of arrangement or wiring by the hard macro cell arrangement unit, the test circuit arrangement and wiring unit, and the user net wiring and connection unit; and a net list output unit that outputs the logic structure net list as a return net list.

3. The apparatus according to claim 1, further comprising:
a test pattern creation unit that creates a test pattern based on the test-synthesized net list.

4. The apparatus according to claim 3, further comprising a conversion unit that creates a failure analysis net list by converting a result of arrangement or wiring by the hard macro cell arrangement unit, the test circuit arrangement and wiring unit, and the user net wiring and connection unit, wherein
the net list output unit further outputs the failure analysis net list and the test pattern.

5. The apparatus according to claim 1, wherein:
each of the hard macro cells includes a plurality of storage elements having different bit/word configurations, and
each of the storage elements has a change unit that changes bit/word configuration.

6. The apparatus according to claim 5, wherein the storage elements have cores having identical bit/word configurations.

7. A method comprising:
extracting a user net list from a user net list database, wherein the user net list includes hard macro cell
extracting a frame from a frame library database, wherein the frame includes test circuits and is timing converged;
arranging the hard macro cells on the frame;
creating connection information for connecting the hard macro cells and the test circuits; and
creating a test-synthesized net list by test-synthesizing the user net list based on the connection information.

8. The method according to claim 7, further comprising:
arranging and wiring the test circuits;
wiring a net included in the user net list;
creating a logic structure net list by excluding the test circuits from a result of the arranging, the arranging and wiring, and the wiring; and
outputting the logic structure net list as a return net list.

9. The method according to claim 7, further comprising:
creating a test pattern based on the test-synthesized net list.

10. A computer-readable medium storing a computer program that contains instructions which when executed on a computer causes the computer to execute:
extracting a user net list from a user net list database, wherein the user net list includes hard macro cells;
extracting a frame from a frame library database, wherein the frame includes test circuits and is timing converged;
arranging the hard macro cells on the frame;
creating connection information for connecting the hard macro cells and the test circuits; and
creating a test-synthesized net list by test-synthesizing the user net list based on the connection information.

11. The computer-readable medium according to claim 10, further causing the computer execute:
arranging and wiring the test circuits;
wiring a net included in the user net list;
creating a logic structure net list by excluding the test circuits from a result of the arranging, the arranging and wiring, and the wiring; and
outputting the logic structure net list as a return net list.

12. The computer-readable medium according to claim 10, further causing the computer execute:
creating a test pattern based on the test-synthesized net list.

13. A design support apparatus, comprising:
a controller causing a computer to perform:
extracting a user net list from a user net list database, wherein the user net list includes hard macro cells;
extracting a frame from a frame library database, wherein the frame includes test circuits and is timing converged;
arranging the hard macro cells on the frame;
creating connection information for connecting the hard macro cells and the test circuits; and
creating a test-synthesized net list by test-synthesizing the user net list based on the connection information.

* * * * *

UNITED STATES PATENT AND TRADEMARK OFFICE
CERTIFICATE OF CORRECTION

| | |
|---|---|
| PATENT NO. | : 7,315,997 B2 |
| APPLICATION NO. | : 10/846517 |
| DATED | : January 1, 2008 |
| INVENTOR(S) | : Hitoshi Watanabe et al. |

It is certified that error appears in the above-identified patent and that said Letters Patent is hereby corrected as shown below:

Column 20, Line 60, after "wires" insert --a--.

Column 21, Line 25, change "cell" to --cells;--.

Signed and Sealed this

Seventeenth Day of June, 2008

JON W. DUDAS
*Director of the United States Patent and Trademark Office*